(12) United States Patent
Wang et al.

(10) Patent No.: US 11,211,339 B2
(45) Date of Patent: *Dec. 28, 2021

(54) SEMICONDUCTOR DEVICE

(71) Applicant: TAIWAN SEMICONDUCTOR MANUFACTURING COMPANY LTD., Hsinchu (TW)

(72) Inventors: Chuei-Tang Wang, Taichung (TW); Vincent Chen, Taipei (TW); Tzu-Chun Tang, Kaohsiung (TW); Chen-Hua Yu, Hsinchu (TW); Ching-Feng Yang, Taipei (TW); Ming-Kai Liu, Hsinchu (TW); Yen-Ping Wang, Changhua County (TW); Kai-Chiang Wu, Hsinchu (TW); Shou Zen Chang, Hsinchu (TW); Wei-Ting Lin, Taipei (TW); Chun-Lin Lu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 43 days.

This patent is subject to a terminal disclaimer.

(21) Appl. No.: 16/703,468

(22) Filed: Dec. 4, 2019

(65) Prior Publication Data
US 2020/0111753 A1    Apr. 9, 2020

Related U.S. Application Data

(63) Continuation of application No. 16/056,021, filed on Aug. 6, 2018, now Pat. No. 10,510,681, which is a
(Continued)

(51) Int. Cl.
*H01L 23/58* (2006.01)
*H01L 23/552* (2006.01)
*H01L 21/78* (2006.01)
*H01L 23/31* (2006.01)
*H01L 23/528* (2006.01)
(Continued)

(52) U.S. Cl.
CPC ............ *H01L 23/552* (2013.01); *H01L 21/78* (2013.01); *H01L 23/3178* (2013.01); *H01L 23/528* (2013.01); *H01L 23/585* (2013.01); *H01L 24/03* (2013.01); *H01L 24/08* (2013.01); *H01L 24/17* (2013.01); *H01L 25/0652* (2013.01); *H01L 25/50* (2013.01); *H01L 2224/02371* (2013.01); *H01L 2224/02381* (2013.01); *H01L 2224/0401* (2013.01); *H01L 2224/08137* (2013.01); *H01L 2224/08148* (2013.01); *H01L 2224/08238* (2013.01); *H01L 2224/16148* (2013.01); *H01L 2224/18* (2013.01); *H01L 2924/1434* (2013.01)

(58) Field of Classification Search
None
See application file for complete search history.

(56) References Cited

U.S. PATENT DOCUMENTS 10,043,761 B2 *  8/2018  Wang ................. H01L 24/03
10,510,681 B2 * 12/2019  Wang ................. H01L 25/50

* cited by examiner

*Primary Examiner* — Michael Lebentritt
(74) *Attorney, Agent, or Firm* — WPAT, P.C., Intellectual Property Attorneys; Anthony King

(57) ABSTRACT

A semiconductor device includes a semiconductor die having an insulative layer and a conductive feature in the insulative layer, and a shield in contact with a lateral surface of the conductive feature. In some embodiments, the lateral surface of the conductive feature is aligned with an edge of the insulating material.

20 Claims, 30 Drawing Sheets

Related U.S. Application Data continuation of application No. 14/886,996, filed on Oct. 19, 2015, now Pat. No. 10,043,761.

(51) Int. Cl.
*H01L 23/00* (2006.01)
*H01L 25/065* (2006.01)
*H01L 25/00* (2006.01)

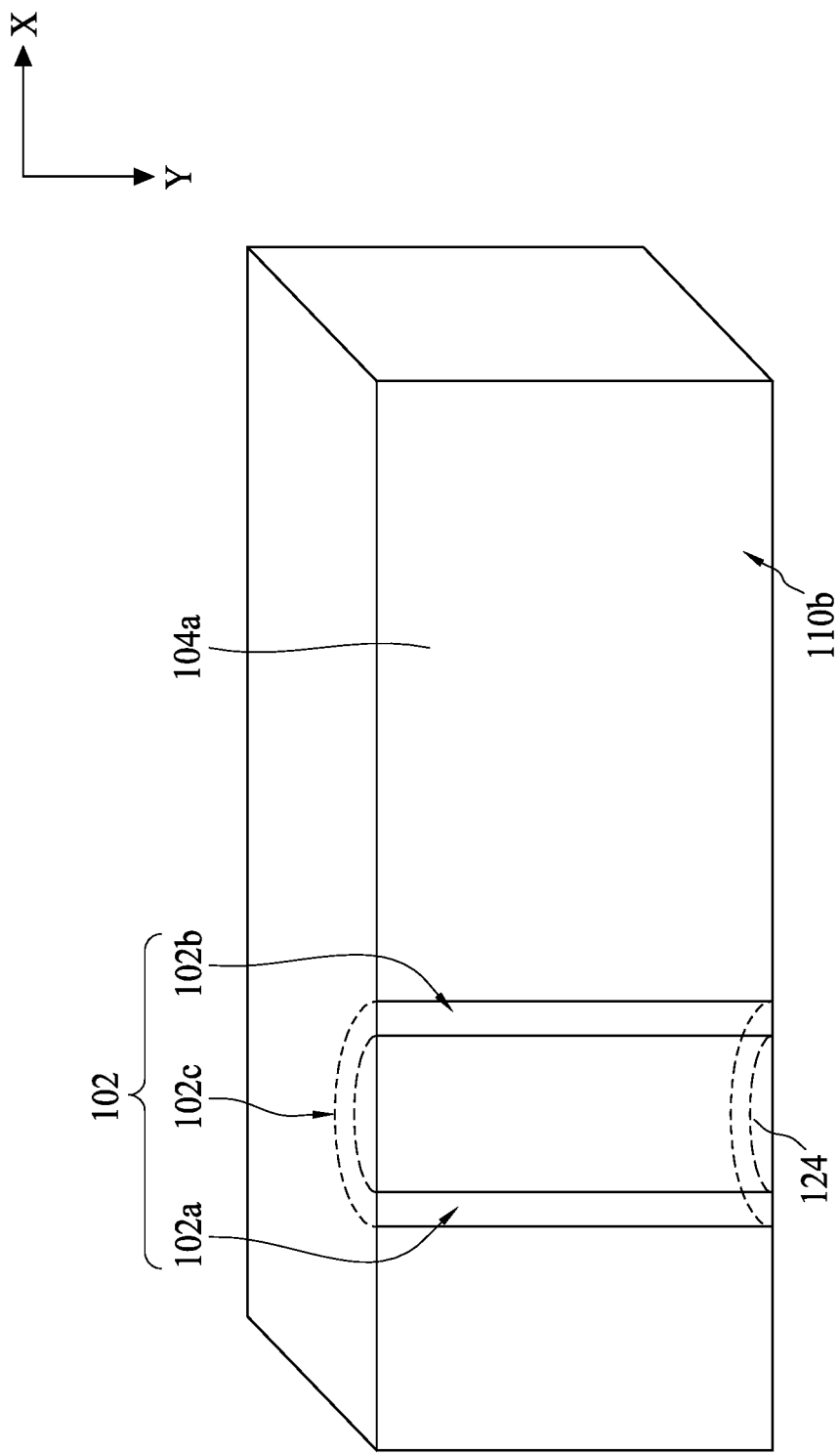

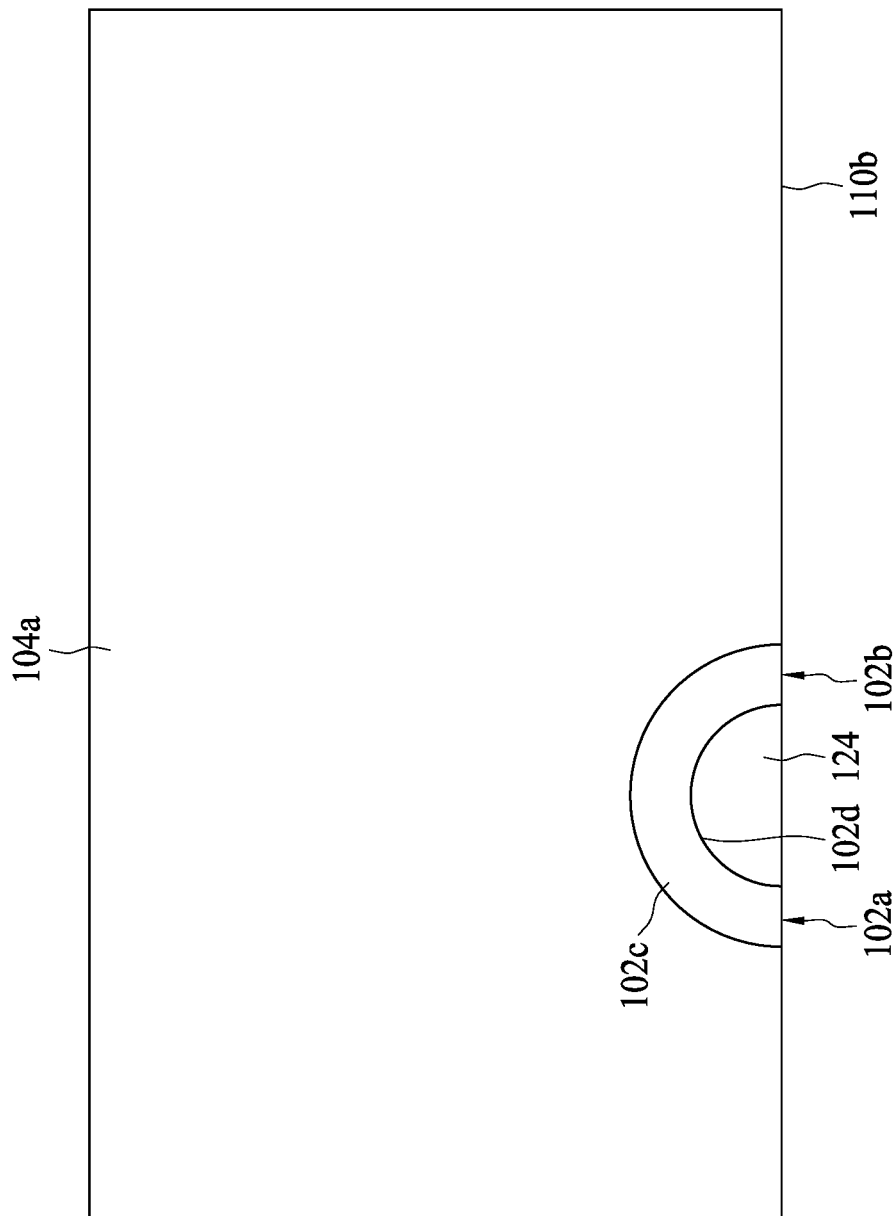

SEMICONDUCTOR DEVICE

CROSS REFERENCE TO RELATED APPLICATIONS

This application is a continuation of application Ser. No. 16/056,021, filed on Aug. 6, 2018, entitled of "SEMICONDUCTOR DEVICE", which is a continuation of application Ser. No. 14/886,996, filed on Oct. 19, 2015, the entire disclosure of which is hereby incorporated by reference.

BACKGROUND

Presently, the electronic equipments are indispensable from our daily life, which involves and incorporates with many electronic components. In an electronic industry, the electronic components consisting dies are widely adopted in various electronic equipments and applications. As the electronic industry progresses, a miniaturization and higher functions of the electronic components are increasingly emphasized. The demands on miniaturization and higher functions of the electronic components result in more complicated and denser configuration.

The major trend in the electronic industry is to make the electronic components lighter, smaller, more multifunctional, more powerful, more reliable and less expensive. Thus, a wafer level packaging (WLP) technology has been gaining in popularity. This technology provides a manufacturing of the electronic components at a wafer level, and is widely applied in order to meet continuous demands toward the miniaturization and higher functions of the electronic components.

As the applications and complexity of the wafer level packages increase, there are more challenges to the reliability and stability. As such, improvements in the structure and method for a WLP continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a perspective view of a semiconductor device in accordance with some embodiments.

FIG. 2A is a top view of the semiconductor device in FIG. 2.

DETAILED DESCRIPTION

Figure 1:
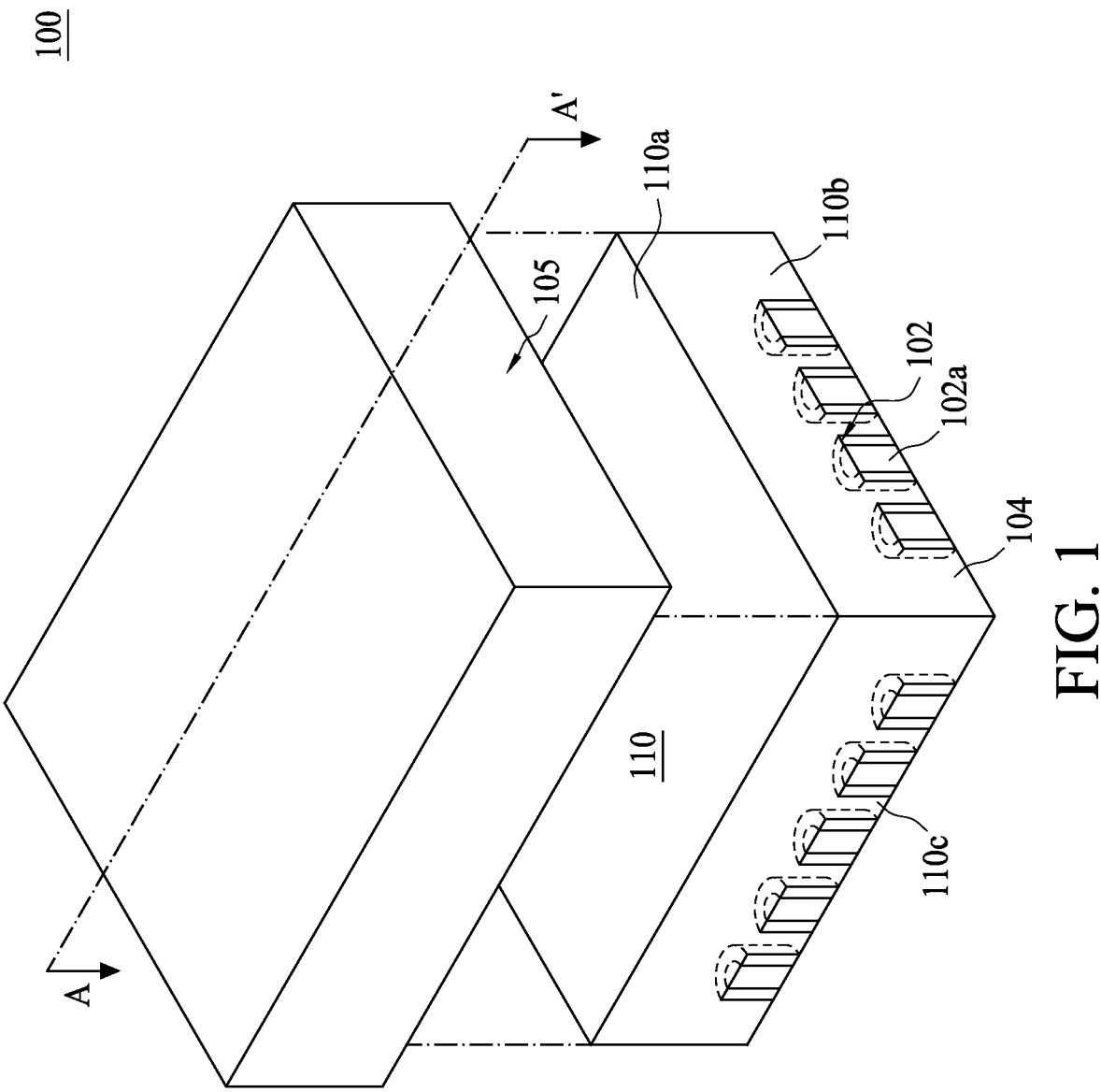
FIG. 1 is an anti-EMI semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a three dimensional (3D) semiconductor package is formed to have at least two semiconductor dies stacked in a direction along the thickness of each individual die. The 3D semiconductor package can be formed by utilizing a fan-in or fan-out wafer level package technology. A conductive structure is disposed between the stacked dies. For a conductive structure which provides electrical communication for any of the dies in the 3D semiconductor package, is called "active redistribution layer" (active RDL) in the present disclosure. However, for a conductive structure that does not provide intra-communication between the stack dies or inter-communication between the 3D semiconductor package and other external device, is called "dummy redistribution layer" (dummy RDL) in the present disclosure. An insulative material such as molding is adopted to surround the stacked dies and the conductive structure in order to form an integrated 3D semiconductor package. In some embodiments, the insulative material has at least three layers in which each layer may be formed with a different insulative material. Each of the three layers is designed to substantially surround a die or the RDL. The insulative material protects the die or RDL from undesired electrical contact or foreign contamination. The interface between different insulative layers may be observed with a stained cross sectional view under a microscope.

In the present disclosure, a conductive feature is disposed in the insulative material and extended upwardly for a determined height. The insulative material is at least extended through one insulative layer. In some embodiments, the determined height is at least equal or greater than a thickness of one of the stacked dies. The conductive feature is disposed in a periphery region of the 3D semiconductor package and configured to be connected with a ground terminal of the 3D semiconductor package. For some cases, the conductive structure is in an edge of the insulative material and different from the RDL, the conductive feature is located in a same level of one of the stacked dies rather than between the stacked dies. Moreover, the conductive feature is not electrically connected with any die in the 3D semiconductor package, i.e. there is no communication between the conductive feature and any of the stacked dies. In some embodiments, the conductive feature is further connected to a dummy RDL.

The 3D semiconductor package also includes a shield for protecting the stacked dies resided inside the shield from an external EMI (Electromagnetic Interference) disturbance. The shield is configured as a shell covering an inner molded 3D semiconductor construction (may leave one side opened if necessary). In some embodiments, the shield is in contact with an external surface of the insulative material and also electrically connected with the conductive feature such that the shield can be electrically connected to the ground terminal of the 3D semiconductor package through the conductive feature. In some embodiments, the shield is in contact with a portion of the conductive feature.

FIG. 1 is an exploded view of an embodiment of an anti-EMI semiconductor device 100. The semiconductor device 100 is a 3D semiconductor package and includes a shield 105 to cover a molded construction 110 having at least one semiconductor die resided inside (not shown in the figure). The shield 105 can prevent or degrade external EMI, which may bring noises to the molded construction 110. The molded construction 110 has several external surfaces such as 110a, 110b, and 110c being substantially in contact with the internal wall of the shield 105. In some embodiment, a shape of the shield 105 is conformal to some external surfaces of the molded construction 110. The molded construction 110 also has a conductive feature 102 located at the edge of the molded construction 110 wherein the conductive feature 102 has a surface 102a exposed from an insulative material 104. The surface 102a is in contact with the shield 105.

Figure 1A:
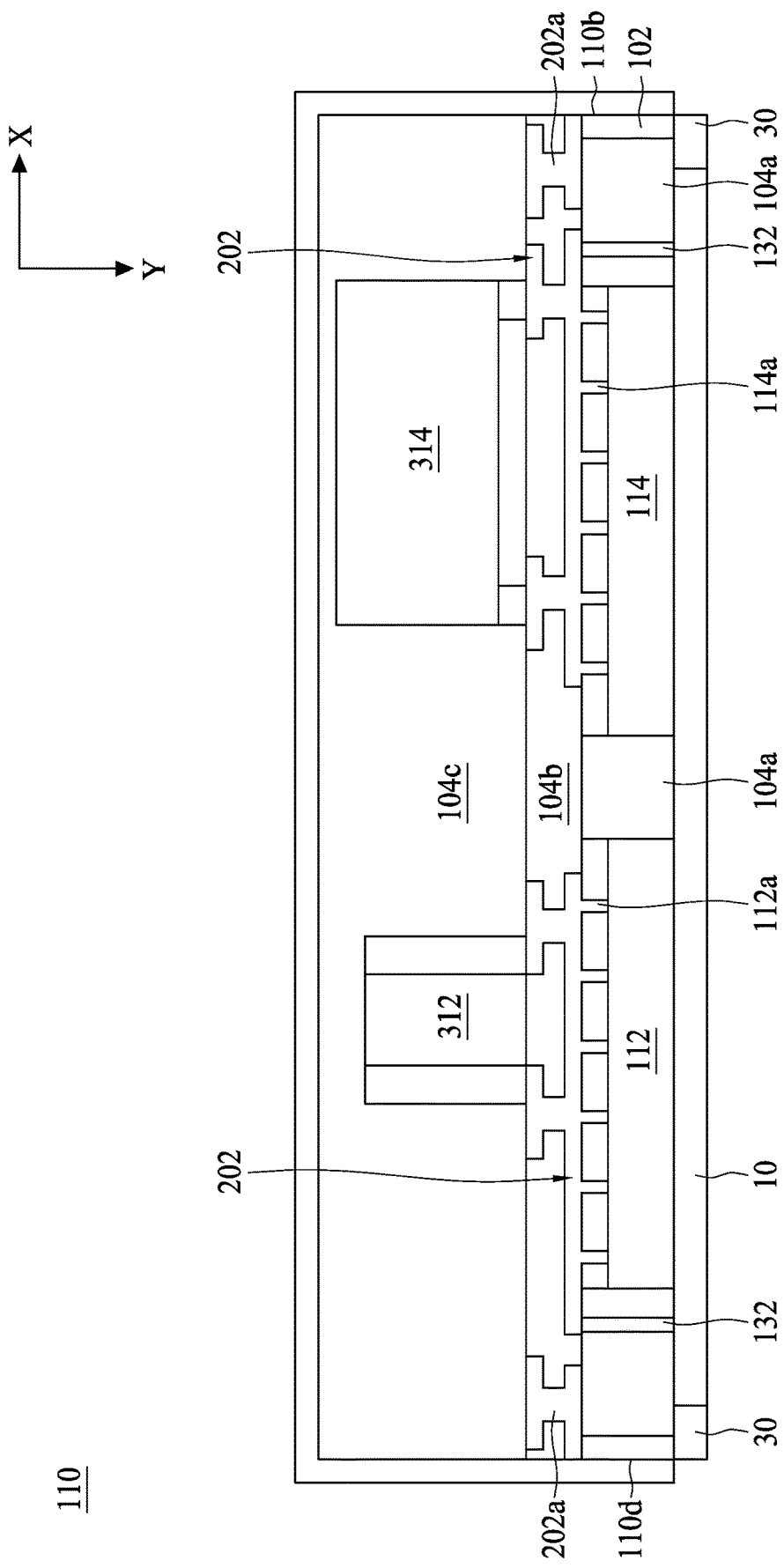
FIG. 1A is a cross sectional view along AA' in FIG. 1 in accordance with some embodiments.

FIG. 1A is the cross sectional view along AA' in FIG. 1. The molded construction 110 is a multi-level structure which has several semiconductor or electronic components stacked or arranged to form a 3D semiconductor molded construction. Semiconductor dies 112 and 114 are located over a substrate 10 and in a first level of the molded construction 110. Semiconductor dies 112 and 114 are arranged to be separated laterally. An insulative layer 104a of the insulative material 104 is filled in the gap between the semiconductor dies 112 and 114. The insulative layer 104a further fills gaps between semiconductor dies and the shield 105 in order to provide insulation for semiconductor dies 112 and 114. In some embodiments, the insulative layer 104a includes dielectric material like oxide, nitride, or the like. In some embodiments, the insulative layer 104a includes molding material like epoxy, resins, phenolic hardeners, silicas, catalysts, pigments, mold release agents, or the like. The semiconductor dies 112 and 114 may be disposed on the substrate 10 through a wafer level fan-in or fan-out operation. Some micro conductive pillars such as conductive pillars 112a and 114a are formed over active surfaces of the semiconductor dies 112 and 114. The conductive pillars 112a and 114a are respectively electrically connected with the internal circuitry in the semiconductor dies 112 and 114. Each conductive pillar 112a or 114a is extended upwardly from the active surface of each die and the top surface of each conductive pillar 112a or 114a is exposed from insulative layer 104a. The top surface of each conductive pillar 112a or 114a can be connected with a conductive trace disposed over the insulative layer 104a.

Over the insulative layer 104a is an insulative layer 104b, which is also a portion of the insulative material 104. The insulative layer 104b is in the second level of the molded construction 110. The insulative layer 104b is extended substantially parallel to the insulative layer 104a. The insulative layer 104b is also over semiconductor dies 112 and 114. Conductive structure 202 is also located in the second level and embedded in the insulative layer 104b. In some embodiments, the insulative layer 104b includes photo sensitive dielectric such as polybenzoxazole (PBO), polyimide, or the like. The conductive structure 202 is over the semiconductor dies 112 and 114 and further connected to the conductive pillars 112a and 114a. The conductive structure 202 is electrically coupled to the semiconductor dies 112 and 114 through the conductive pillars 112a and 114a. In some embodiments, the conductive structure 202 is also called active RDL and includes some conductive traces or vias. A portion of the conductive structure such as 202a is not connected to the conductive pillars 112a or 114a. The conductive structure 202a is also called dummy RDL because it is not electrically coupled to either semiconductor die 112 or 114. In some embodiments, conductive structure 202 is formed after the formation of the uppermost passivation of the semiconductor dies 112 and 114, thus also being called post passivation interconnect (PPI).

Some components including an electronic device 312 and a semiconductor die 314 are located over the substrate 10 and located in a third level of the molded construction 110. The electronic device 312 and semiconductor die 314 are arranged to be separated laterally. An insulative layer 104c of the insulative material 104 is filled in the gap between the electronic device 312 and semiconductor die 314. The insulative layer 104c further fills gaps between the components and the shield 105 in order to provide insulation for electronic device 312 and semiconductor die 314. In some embodiments, the insulative layer 104c includes molding material like epoxy, resins, phenolic hardeners, silicas, catalysts, pigments, mold release agents, or the like. The electronic device 312 and semiconductor die 314 are stacked over semiconductor dies 112 and 114 in a 3D arrangement. The communication between the components (electronic device 312 and semiconductor die 314) and the semiconductor dies 112 and 114 is through the conductive structure 202 in the second level. In other words, the stacked dies or components are communicatively coupled through the conductive structure 202. Some of the components in the third level may have similar features like micro pillars or vias as those in the first level; however, they are omitted in the drawings for simplicity.

In some embodiments, there is only one component or semiconductor die in the first or the third level respectively. The volume of the molded construction may be changed by different design but the structure is similar to the molded construction 110 in FIG. 1A.

Still referring to FIG. 1A, the conductive feature 102 disposed in the first level of the molded construction 110 is proximal to an external surface 110b or 110d of the molded construction 110. The conductive feature 102 is extended upwardly from the substrate 10 and through the insulative layer 104a. In some embodiments, the conductive feature 102 has a height which is greater than the thickness of the semiconductor dies 112 and 114. In some embodiments, the height of the conductive feature 102 is equal or greater than the thickness of the insulative layer 104a. The conductive feature 102 is configured to be connected to a ground terminal 30 of the molded construction 110. The conductive feature 102 is in contact with the shield 105 such that the shield 105 is electrically coupled to the ground terminal 30 through the conductive feature 102. In some embodiments, there may be some conductive elements interposed in the grounding path and between the conductive feature 102 and the ground terminal 30.

FIG. 2 is an illustrative drawing of a portion of the first level of the molded construction 110 in FIG. 1A while an observer is viewing from x-direction. The x-direction in the present disclosure is perpendicular to the y-direction, which is also the direction defining the height of the conductive feature 102 or the direction along the thickness of the semiconductor dies 112 or 114. As mentioned in FIG. 1, surface 110b is an external surface of the molded construction 110 facing toward the shield 105. In some embodiments, surface 110b is in contact with the shield 105. Insulative layer 104a is surrounding the conductive feature 102. Two surfaces 102a and 102b of the conductive feature 102 are extended along the y-direction and through the insulative layer 104a. Both surfaces 102a and 102b are not covered by the insulative layer 104a. The surfaces 102a and 102b are designed to be in contact with the shield 105. An insulative material 124 is between surfaces 102a and 102b and is substantially not in contact with the insulative layer 104a. A surface 102c of the conductive feature 102 is also one of the exposed surfaces that are not covered by the insulative layer 104a. The exposed surface 102c can be further connected to another conductive structure overlaid on the insulative layer 104a.

FIG. 2A is an illustrative drawing viewing from the y-direction (referred as top view in the present disclosure) in FIG. 2. The top view shows that the conductive feature 102 has a continuous inner surface 102d (shown as a line in FIG. 2A) between surfaces 102a and 102b. The surface 102d may not be observed in FIG. 2 if the insulative material 124 is opaque. The inner surface 102d is extended away from the external surface 110b of the molded construction 110 such that the conductive feature 102 is recessed into the insulative layer 104a and away from the shield 105. The recess between surfaces 102a and 102b is filled with the insulative material 124. In the present disclosure, the conductive feature 102 provides some areas for contacting with the shield 105 and some areas for contacting with the insulative layer 104a or the insulative material 124. As the contact area between the conductive feature 102 and the insulative layer 104a increases, the conductive feature 102 can be secured by the insulative layer 104a if there is any pulling force applied from surface 110b.

Figure 3A:
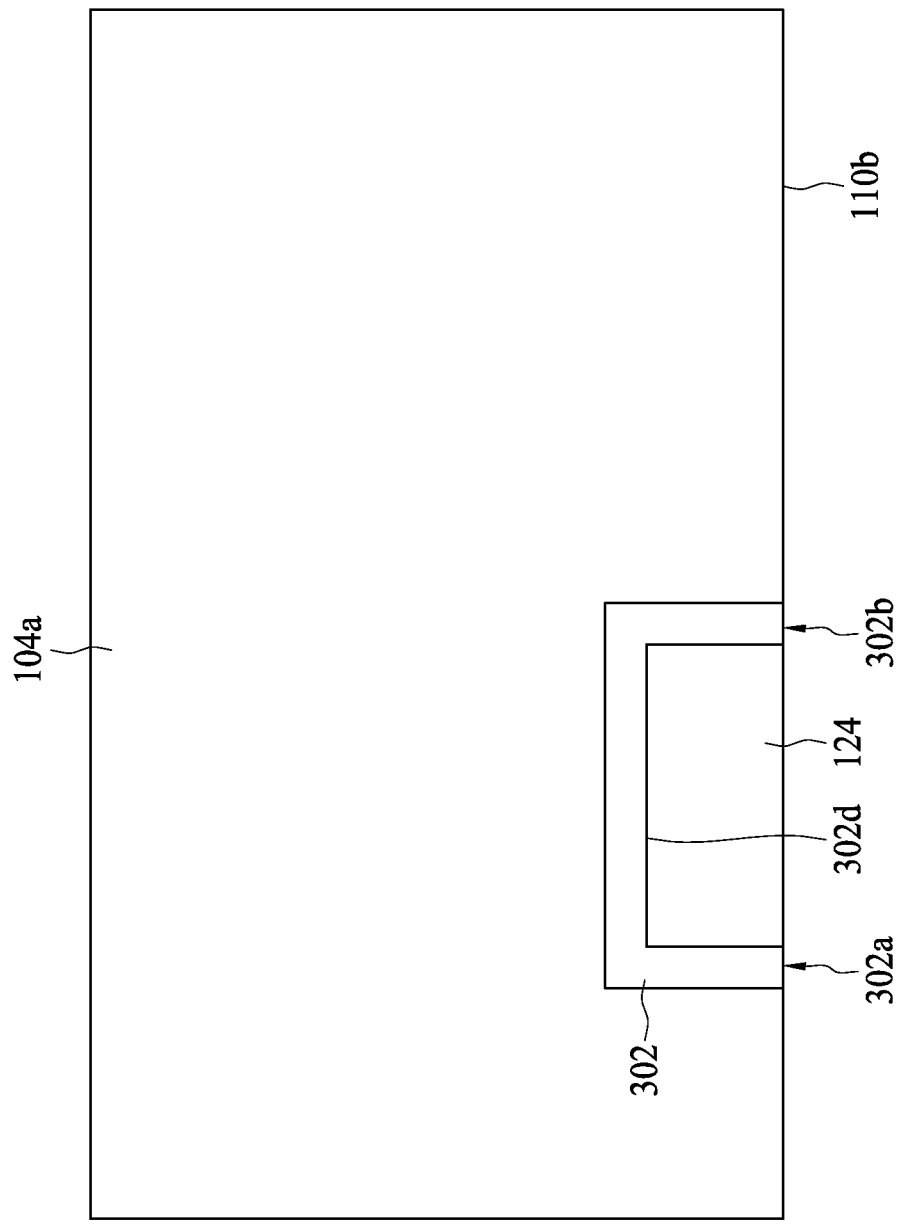
FIG. 3A to FIG. 3E are top views of a conductive feature in an anti-EMI semiconductor device in accordance with some embodiments.

FIG. 3A is another embodiment showing a top view of a conductive feature 302 in the molded construction 110. The conductive feature 302 is in a different shape from the conductive feature 102 in FIG. 2A but has a similar design. The conductive feature 302 is also recessed into the insulative layer 104a and away from the external surface 110b. Unlike the conductive feature 102 is curved into the insulative layer 104a and toward the inner portion of the molded construction 110, the conductive feature 302 has two "L" corners away from the external surface 110b. The conductive feature 302 also forms a quadrilateral space between its inner surface 302d and surface 110b. The quadrilateral space is filled with insulative material 124. Surfaces 302a and 302b are exposed from the insulative layer 104a.

Figure 3B:
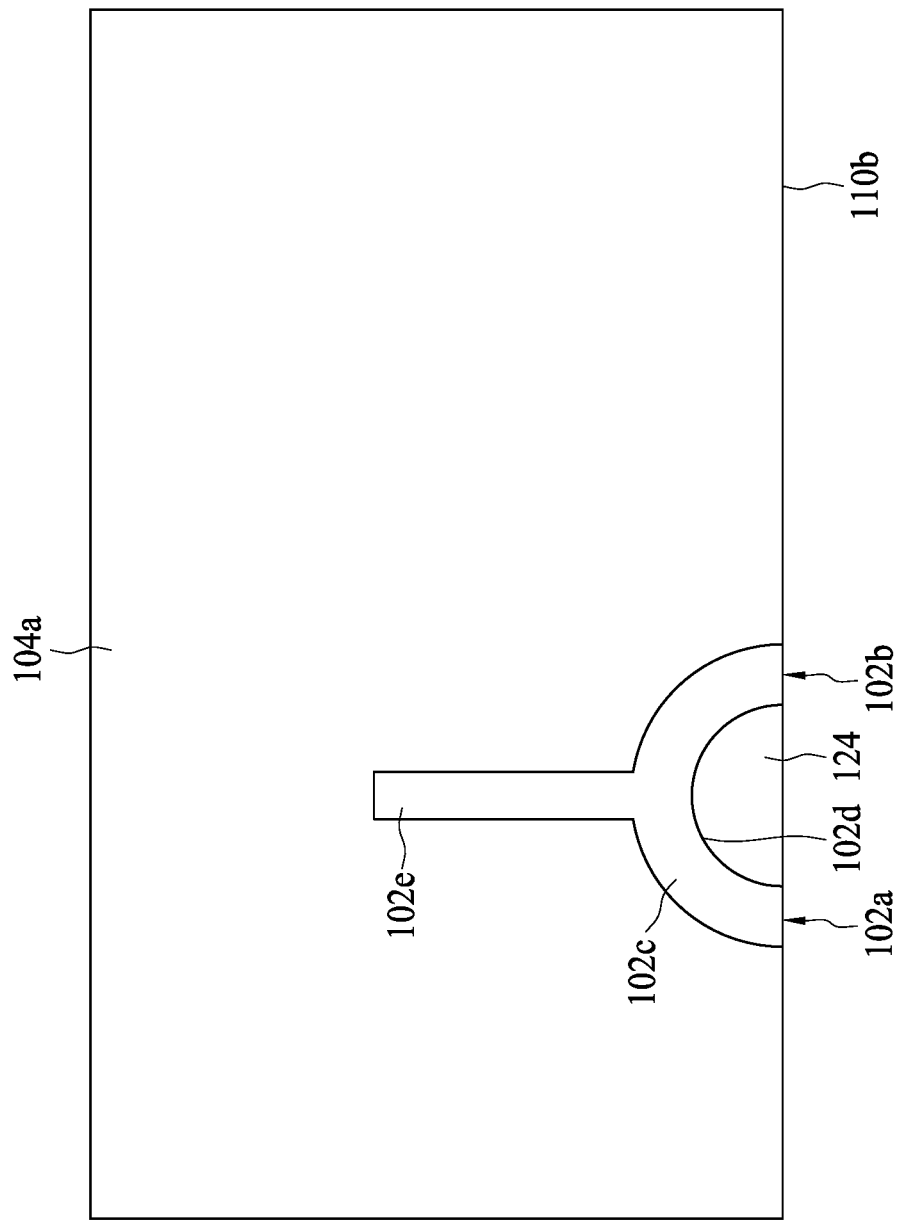

FIG. 3B is a top view of another embodiment showing a conductive feature in the insulative layer 104a. The conductive feature is similar to the conductive feature 102 in FIG. 2A. The conductive feature also has a surface 102d recessed away from the external surface 110b. The conductive feature further includes an extension portion 102e connected to the recessed portion of the conductive feature. The extension portion 102e is extended further away from the external surface 110b than the recessed portion. In some embodiments, the extension portion 102e has a same height as the other portions of the conductive feature and increases the contact area between the conductive feature and the insulative layer 104a.

Figure 3C:
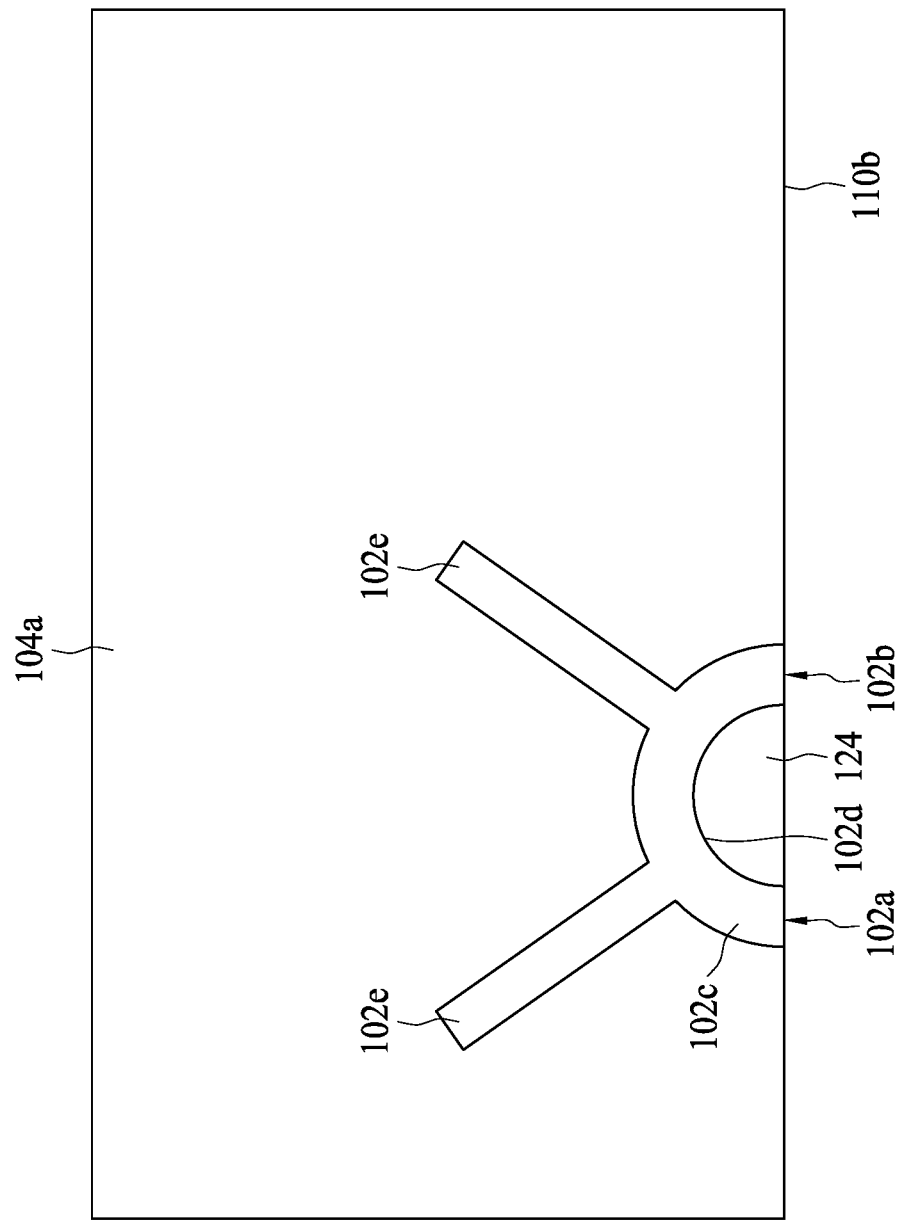

FIG. 3C is a top view of another embodiment showing a conductive feature in the insulative layer 104a. The conductive feature is similar to the conductive feature 102 in FIG. 3B, but the extension portion 102e is designed to have at least two branches connected to the recessed portion of the conductive feature. Each branch is extended away from surface 110b and further into the insulative layer 104a in a radial direction different from each other. In some embodiments, the extension portion 102e has a same height as the recessed portion of the conductive feature. In some embodiments, the extension portion 102e has a height smaller than a height of the recessed portion. The branches of extension portion 102e increase the contact area between the conductive feature and the insulative layer 104a and help secure the recessed portion in the insulative layer 104a. If there is an external pulling force applied from surface 110b, the bonding force between extension portion 102e and the insulative layer 104a provides more resistance to the external pulling force.

Figure 3D:
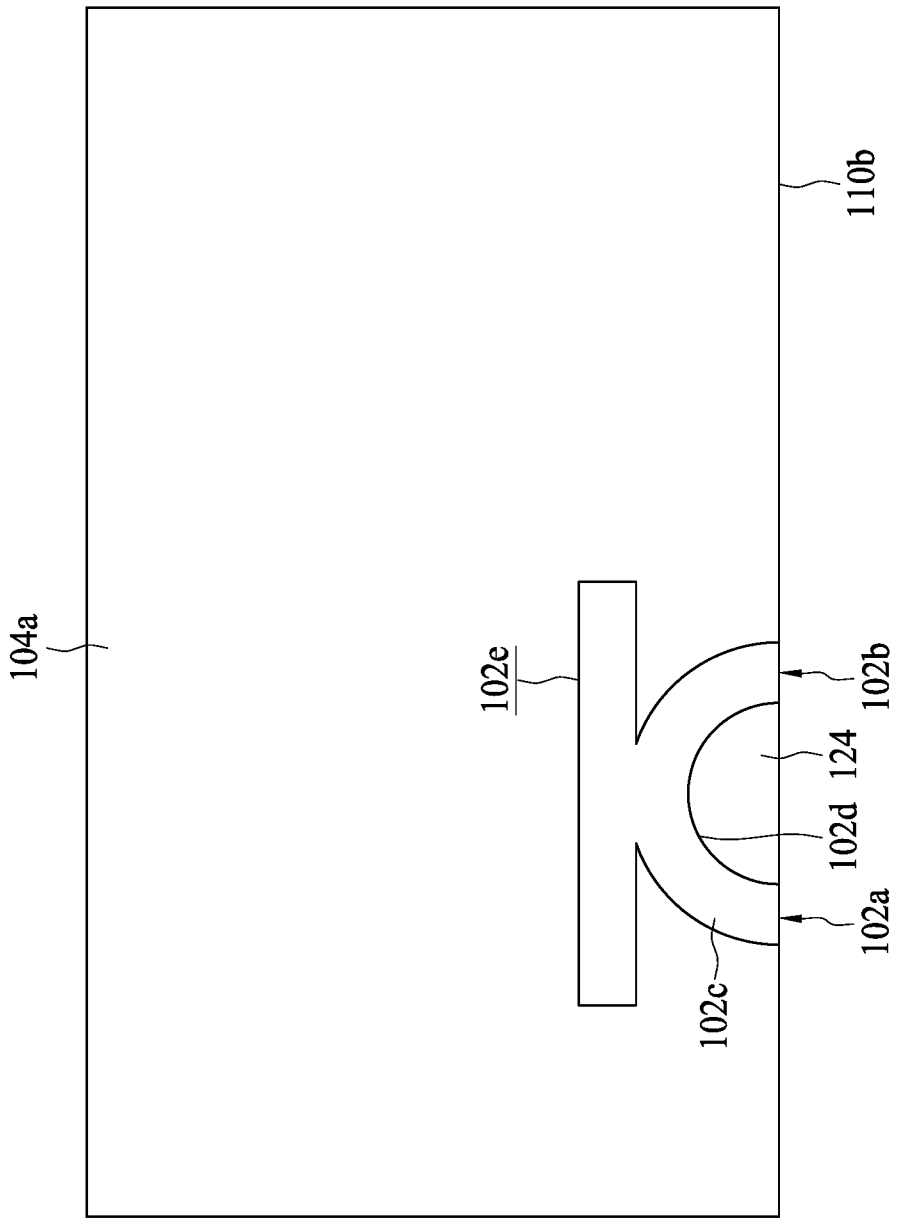

FIG. 3D is another embodiment showing a top view of a conductive feature in the insulative layer 104a. The conductive feature is similar to the conductive feature 102 in FIG. 3C, but the extension portion 102e is designed to be connected to the recessed portion of the conductive feature in a direction substantially parallel to the surface 110b. The extension portion 102e is located further away from the external surface 110b than the recessed portion. The extension portion 102e is extended to be wider than the recessed portion of the conductive feature.

Figure 3E:
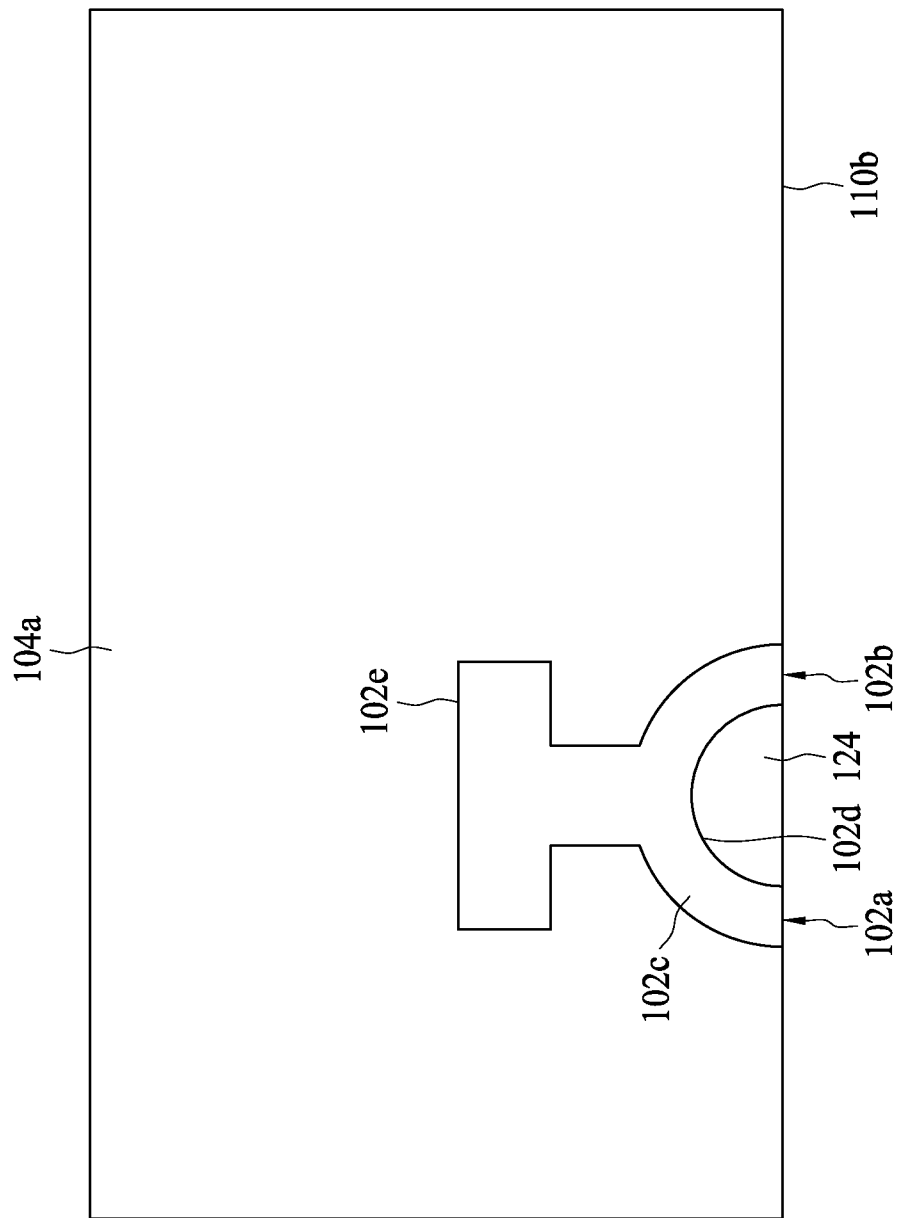

FIG. 3E is another embodiment showing a top view of a conductive feature in the insulative layer 104a. The conductive feature is similar to the conductive feature 102 in FIG. 3D, but the extension portion 102e is designed to be in a T-shaped configuration and connected to the recessed portion of the conductive feature. One side of the extension portion 102e is extended perpendicular to the surface 110b and the other side is extended parallel to the surface 110b. The T-shaped extension portion 102e is located further away from the external surface 110b than the recessed portion. The T-shaped extension portion 102e is contacting with the insulative layer 104a in at least two different directions so as to provide multi-directional bonding force to secure the recessed portion. In the present disclosure, the recessed portion and extension portion can have other different combinations from the embodiments mentioned above.

Figure 4A:
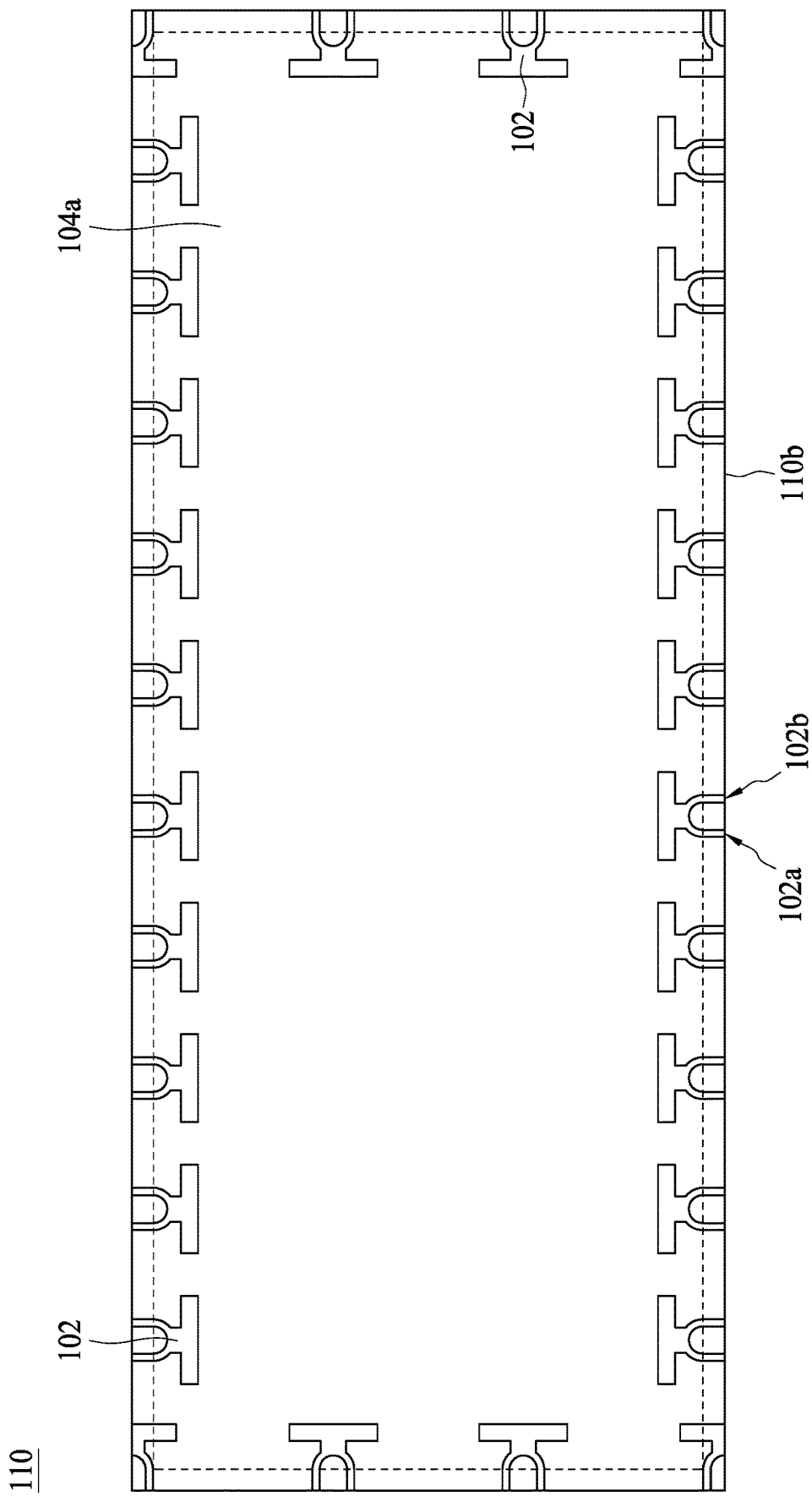
FIG. 4A to FIG. 4C are top views of a portion of an anti-EMI semiconductor device in accordance with some embodiments.

FIG. 4A is a top view of a first level of a molded construction 110. Insulative layer 104a may be opaque such that the semiconductor dies 112 and 114 in FIG. 1A buried in the insulative layer 104a are not observed. Several units of conductive feature 102 are disposed around the periphery of the molded construction 110. Surfaces 102a and 102b are exposed from the insulative layer 104a and configured to be in contact with the EMI shield. In the present embodiment, the units of conductive feature 102 are arranged as a ring circumscribing the edge of the molded construction 110. Each unit conductive feature 102 provides at least two longitudinal surfaces 102a and 102b through the insulative layer 104a for contacting the EMI shield. The multiple contact conductive feature design can further increase the grounding efficiency for the EMI shield.

Figure 4B:
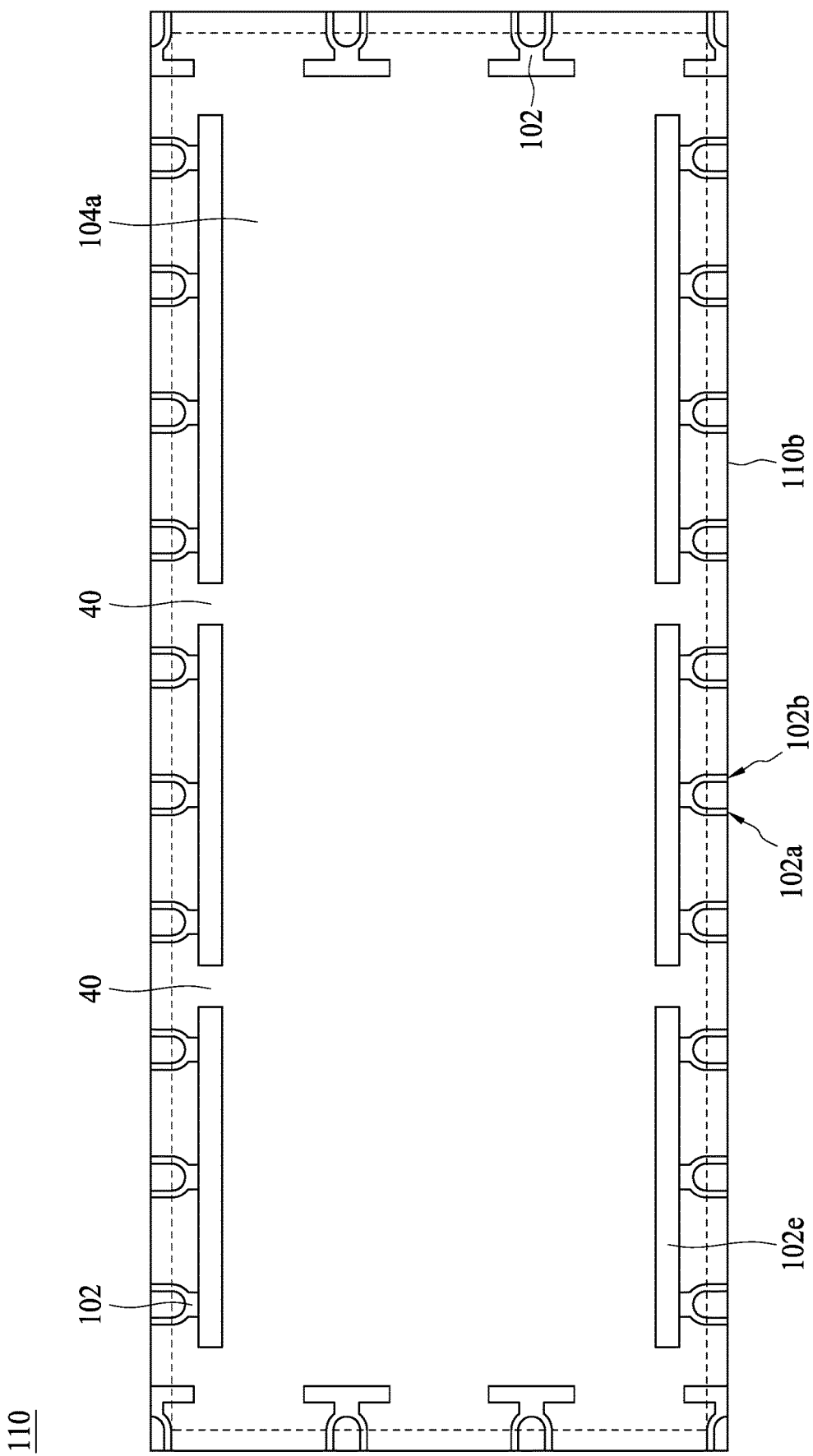

FIG. 4B is a top view of a first level of a molded construction 110 in another embodiment. The extension portion 102e of some conductive feature units are further extended parallel to the surface 110b and merged into one trace. Each trace may be connected to several units of conductive feature. The conductive feature 102 is greater than 50 um or even as tall as about 100 um. An opening 40 is located between adjacent traces. In some embodiments, the insulative layer 104a is formed after forming the conductive feature. If the formation operation for the insulative layer 104a is performed through a molding injection, the conductive feature 102 becomes a barrier for the high viscosity molding material injected within or out of the conductive feature 102. The opening 40 can be configured as a channel for the molding material to travel through. The molding material can flow evenly to form a uniform insulative layer 104a.

Figure 4C:
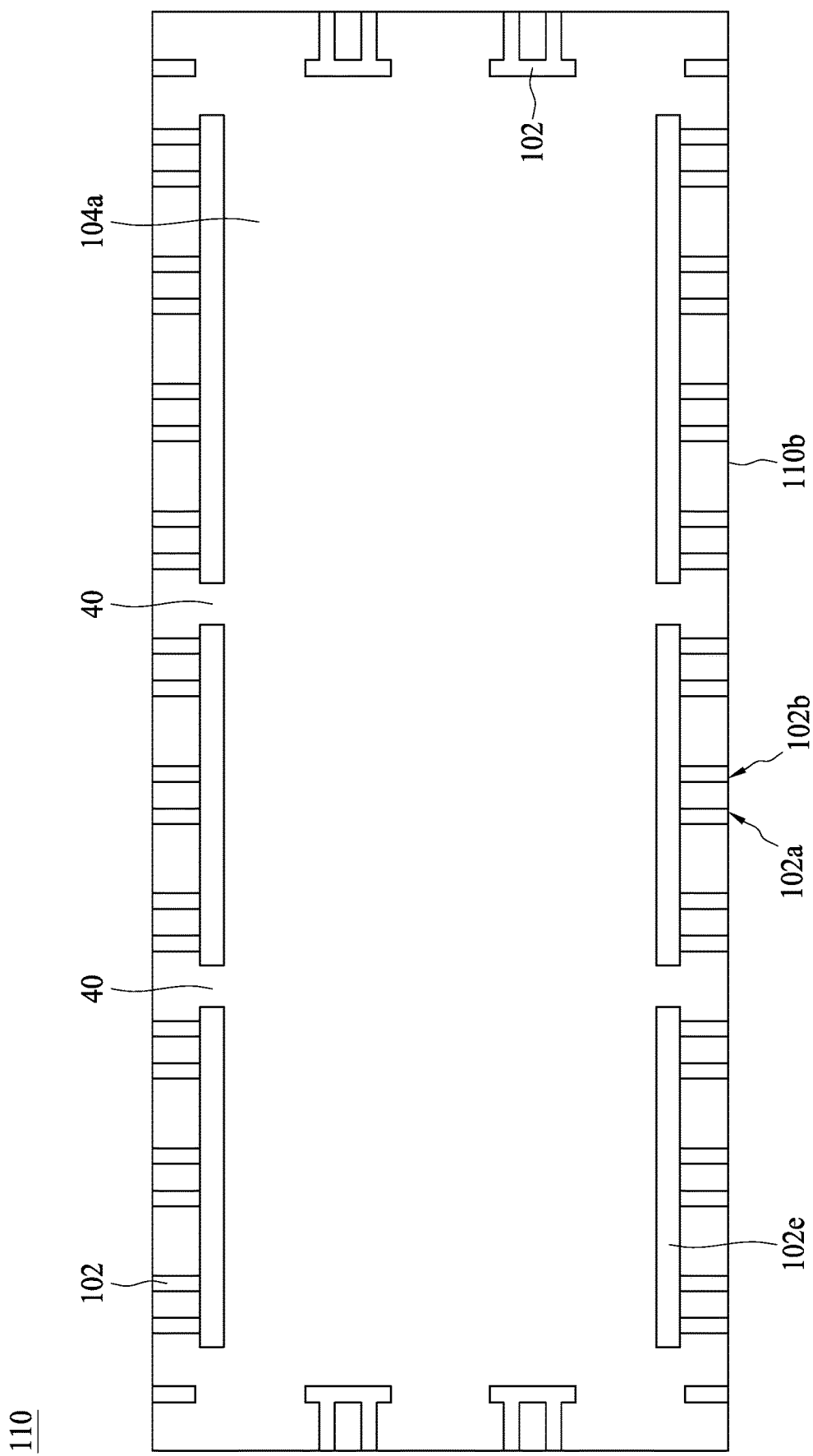

FIG. 4C is a top view of a first level of a molded construction 110 in another embodiment. The extension portion 102e are further extended parallel to the surface 110b and merged into one trace. Each trace may be connected to several units of conductive feature, which have L shape recessed portion. Similar to the embodiment in FIG. 4B, an opening 40 is located between adjacent straight traces.

Figure 5:
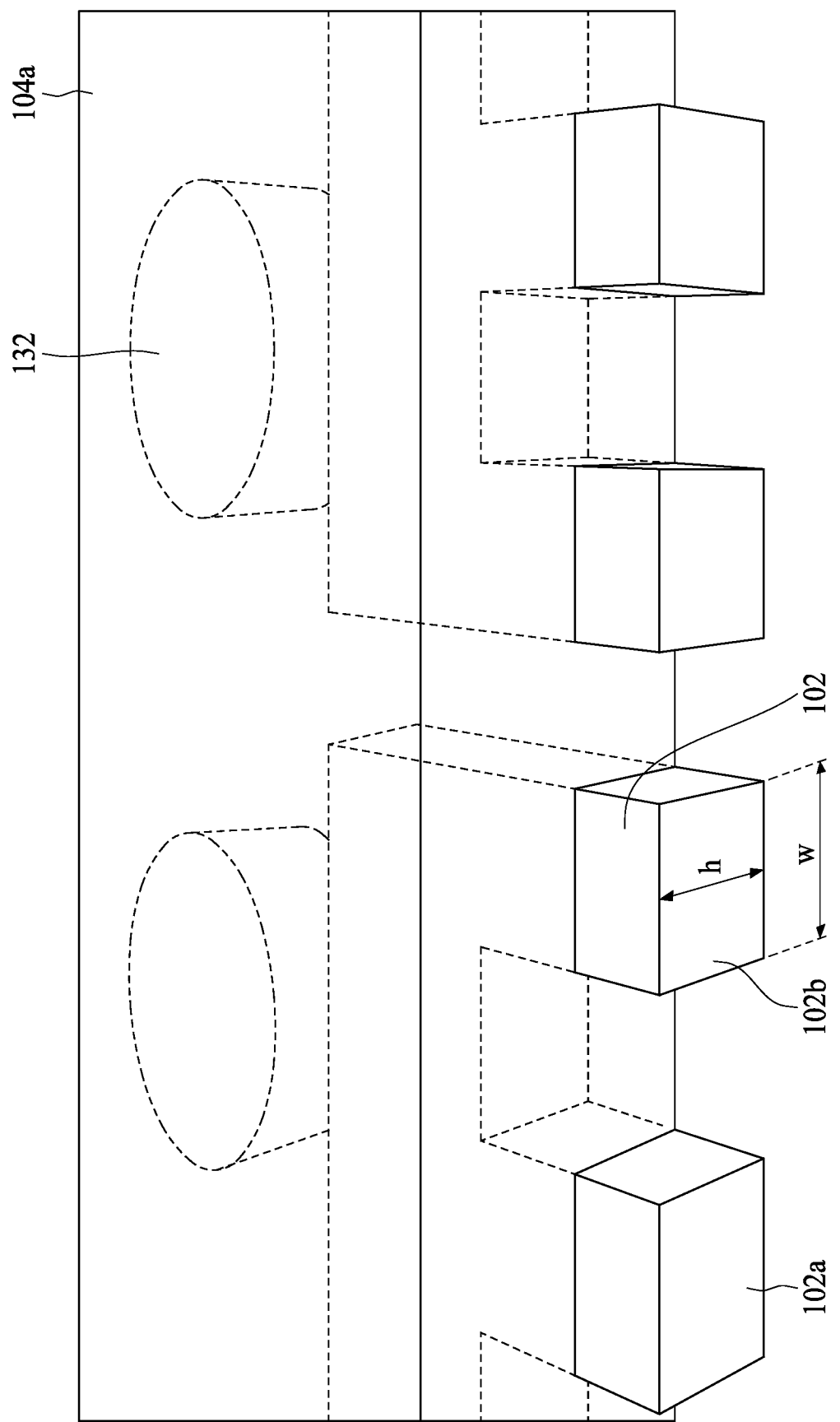
FIG. 5 is a portion of an anti-EMI semiconductor device in accordance with some embodiments.

FIG. 5 is a perspective view of a first level of a molded construction 110 according to an embodiment. The connected conductive feature 102 units are configured as comb shape and the teeth are formed by the aforementioned recessed portion. Surfaces 102a and 102b are exposed from the insulative layer 104a. In some embodiment, the surface 102a or 102b has an aspect ratio (h/w) being about 1.0.

Figure 6:
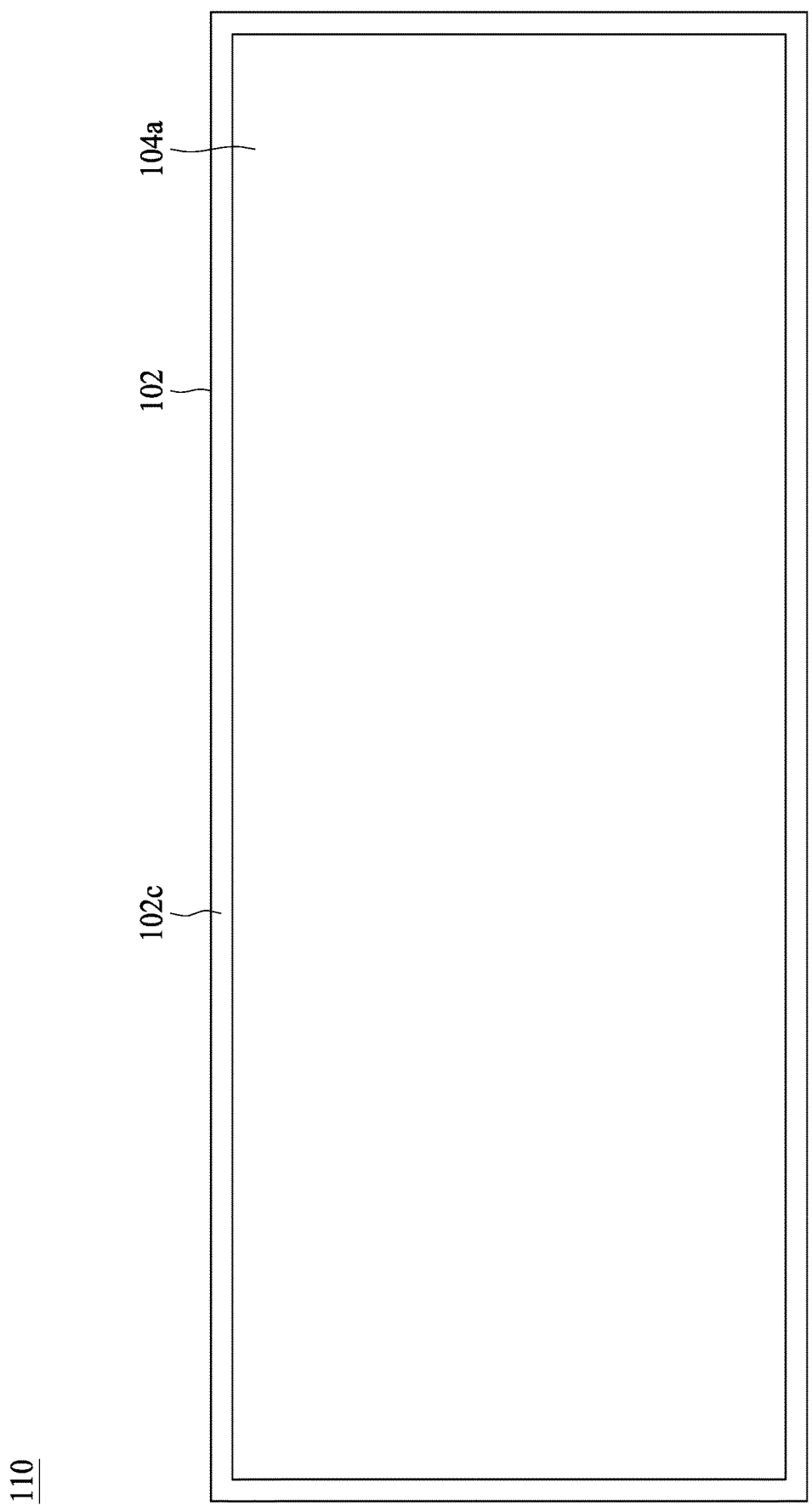
FIG. 6 is a top view of a portion of an anti-EMI semiconductor device in accordance with some embodiments.

FIG. 6 is a top view of a first level of a molded construction 110 in another embodiment. The conductive feature 102 is a loop to enclose the insulative layer 104a. The conductive feature 102 provides a continuous surface to be in contact with the EMI shield. The continuous surface is longitudinally extended through the insulative layer 104a so as to expose surface 102c. The exposed surface 102c can be configured to be in contact with a dummy RDL or a seal ring in the second level.

In the present disclosure, a method is provided to form a 3D semiconductor package. The 3D semiconductor package includes several electronic components such as logic or memory semiconductor die. Some operations of forming the 3D semiconductor package are illustrated below.

Figure 7A:
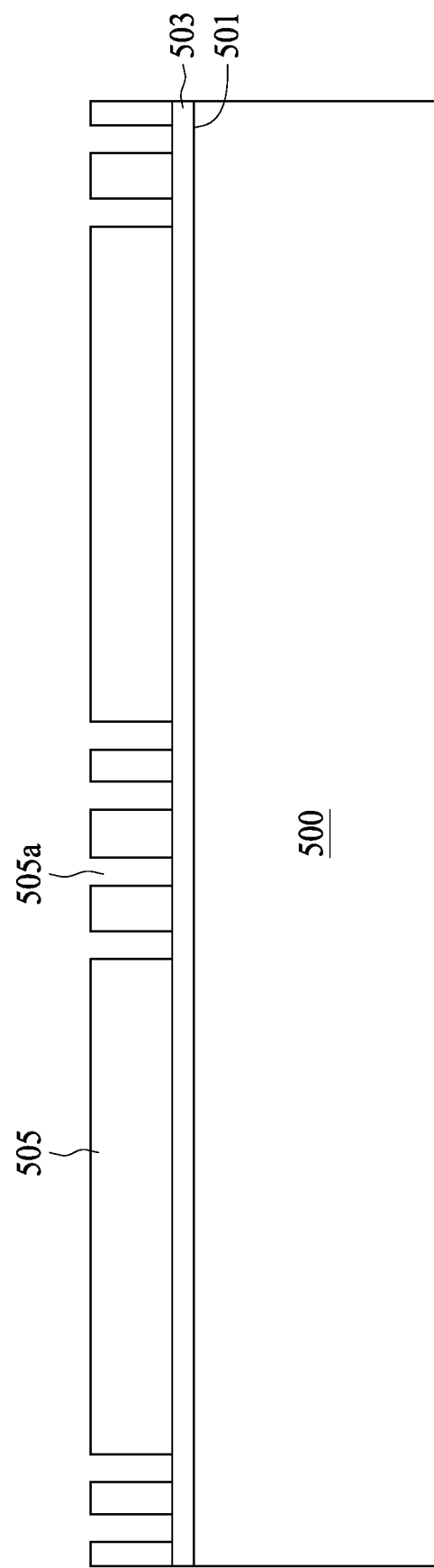
FIG. 7A to FIG. 7B are operations of a method of manufacturing of an anti-EMI semiconductor device in accordance with some embodiments.

In FIG. 7A, a substrate 500 is provided as a carrier or support. A patterned layer 505 is disposed over a top surface 501 of the substrate 500. The patterned layer 505 may be formed by coating a blanket film over the top surface 501 and then carving out a portion of the blanket film to form several openings 505a to expose surface underneath the patterned layer 505. In some embodiments, a light-sensing material such as polyimide, PBO, is used to form the blanket film on the top surface 501, then followed by an photolithography or etch operation to form the pattern layer 505. An interfacial layer 503 can be optionally disposed between the pattern layer 505 and the substrate 500. The substrate 500 used in the method may include silicon, glass, blue tape, dry film, etc. The original substrate 500 may be replaced with a different substrate during a transfer operation which is omitted in the present disclosure.

Figure 7B:
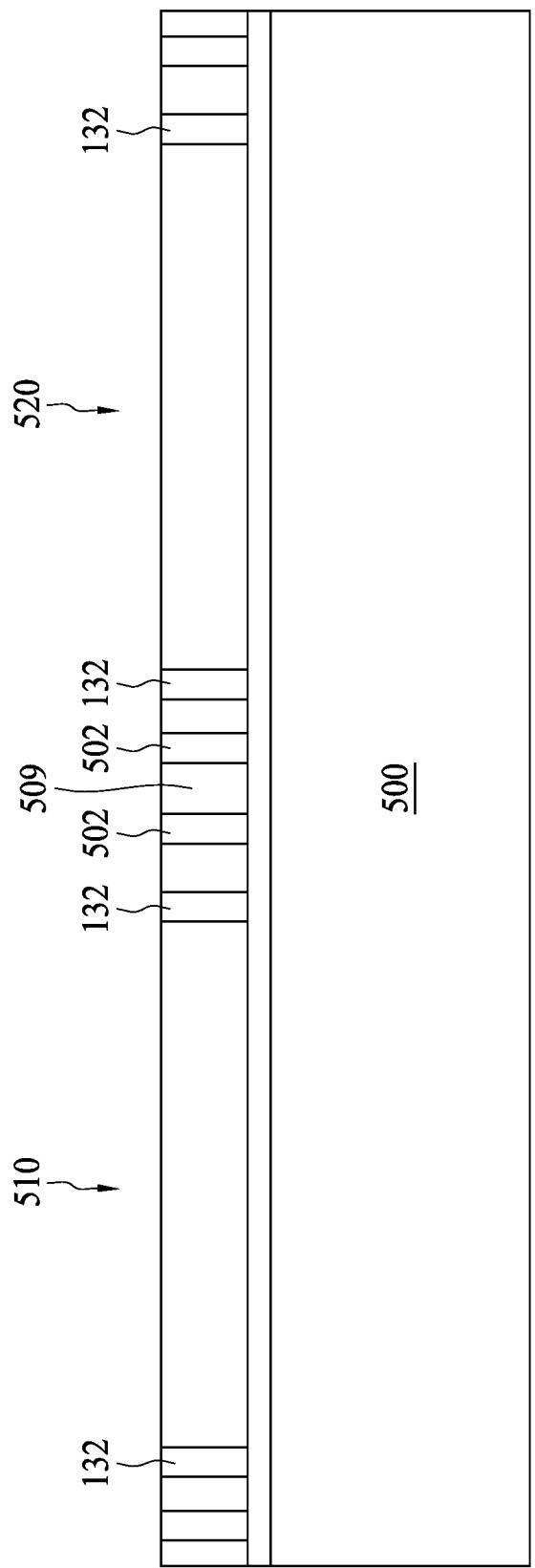

In FIG. 7B, after a seed layer (omitted in drawing) being disposed in the openings 505a, a conductive material is filled in the openings 505a and further extended upwardly from the top surface 501. Dummy conductive patterns 502 of the conductive material are formed between two cells 510 and 520. The cells 510 and 520 are configured to receive semiconductor die. A scribe line region 509 is between dummy conductive portions 502, a singulation operation can be performed through the scribe line region 509 to separate cells 510 and 520.

Figure 7C:
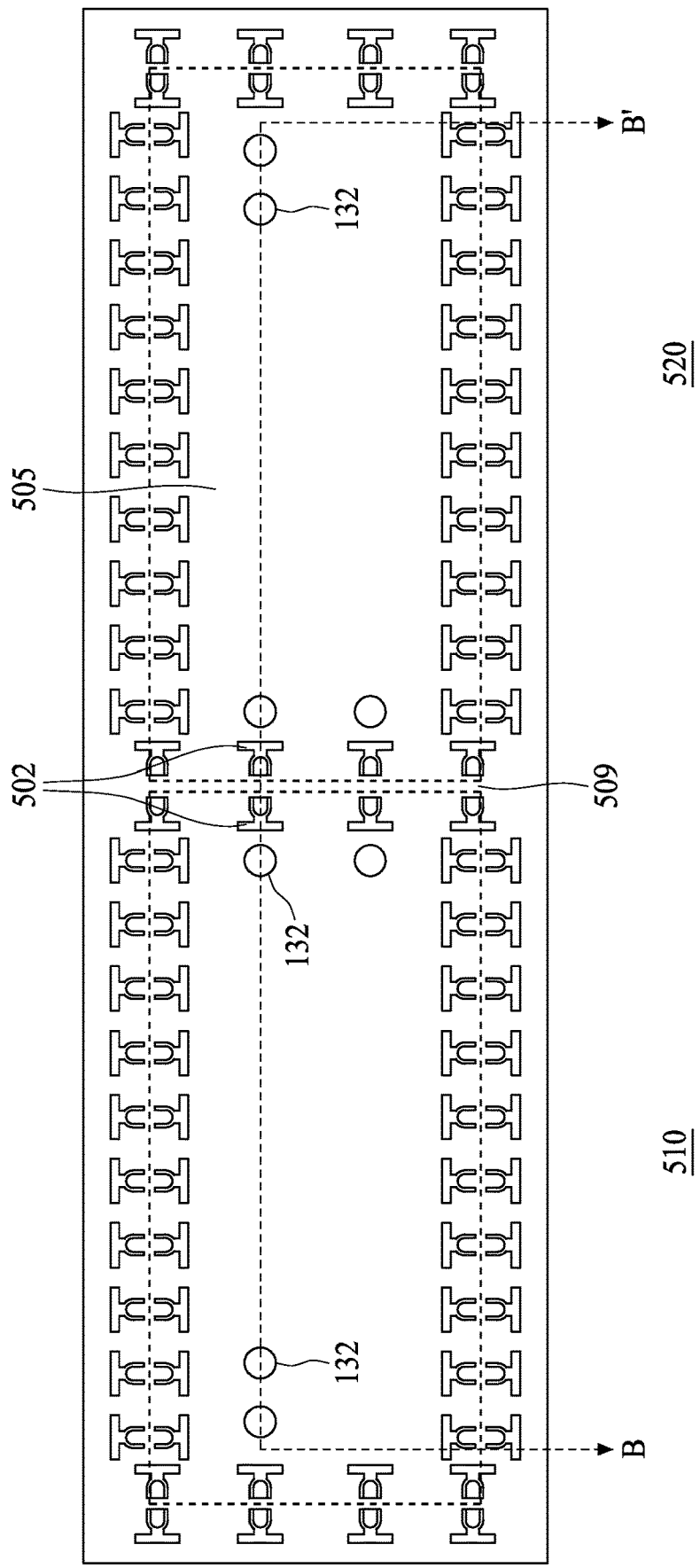
FIG. 7C is a top view of a portion of an anti-EMI semiconductor device in accordance with some embodiments.

FIG. 7B is a cross sectional view along line BB' in FIG. 7C, two cells (510 and 520) are included and bordered with the scribe line region 509. A singulation operation will be performed through the scribe line region 509 to separate these two cells into two singulated semiconductor packages. The conductive material is filled in the openings 505a in FIG. 7A and forms several active conductive posts 132 inside each cell. The conductive posts 132 are configured to connect with active RDL disposed later on. During the same filling operation, the conductive material also forms dummy conductive pattern 502 around the periphery of each cell. The dummy conductive pattern 502 includes repetitive dummy units surrounding the edge of each cell. The repetitive unit has a different shape from the active conductive post 132 and has a portion recessed away from the scribe line region 509. The active conductive posts 132 is fully filled by conductive material and has no recessed portion formed therein.

Figure 8A:
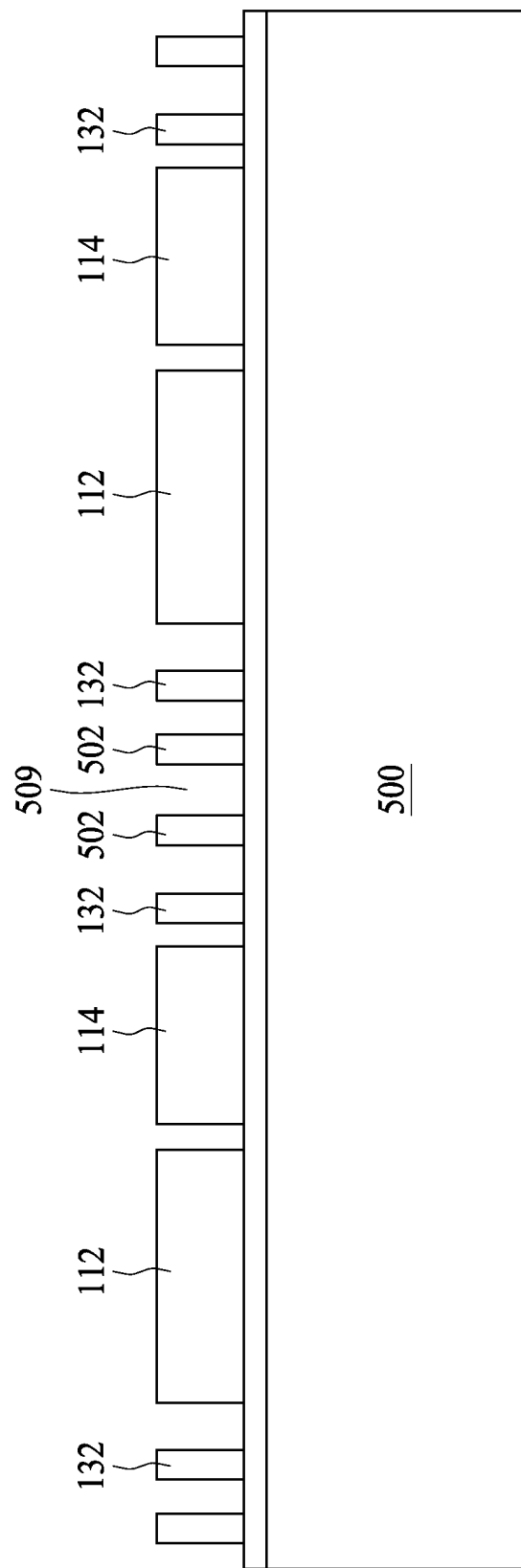
FIG. 8A to FIG. 8D are operations of a method of manufacturing of an anti-EMI semiconductor device in accordance with some embodiments.

In FIG. 8A, the patterned layer 505 is removed after the conductive post 132 and dummy conductive pattern 502 formed over the substrate 500. Some electronic components (such as the semiconductor dies 112 and 114) are disposed in each cell and over the substrate 500. The electronic components may be a singulated semiconductor die or a packaged component. Each cell can receive at least one electronic component. As in FIG. 8A, two singulated semiconductor dies 112 and 114 corresponding to the semiconductor dies in FIG. 1A are inserted in each cell.

Figure 8B:
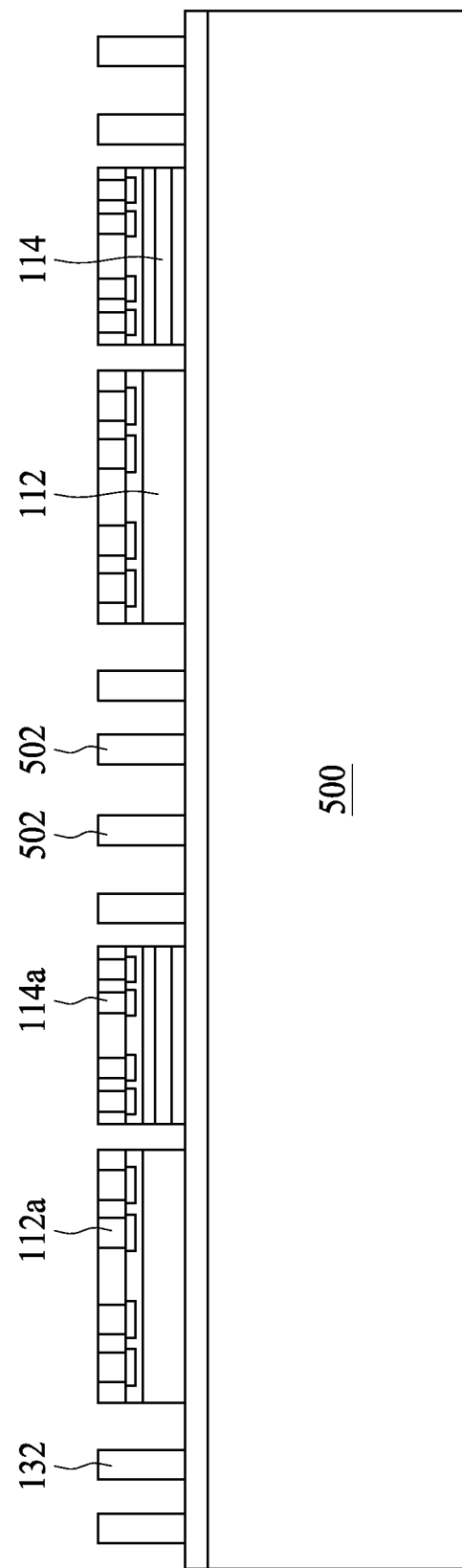

In some embodiments, pillars are formed on the semiconductor dies 112 and 114 before disposing over the substrate 500. As in FIG. 8B, the conductive pillars 112a and 114a are formed over the bond pads of semiconductor dies 112 and 114. The pillars can connect the semiconductor dies with active RDL disposed later on.

Figure 8C:
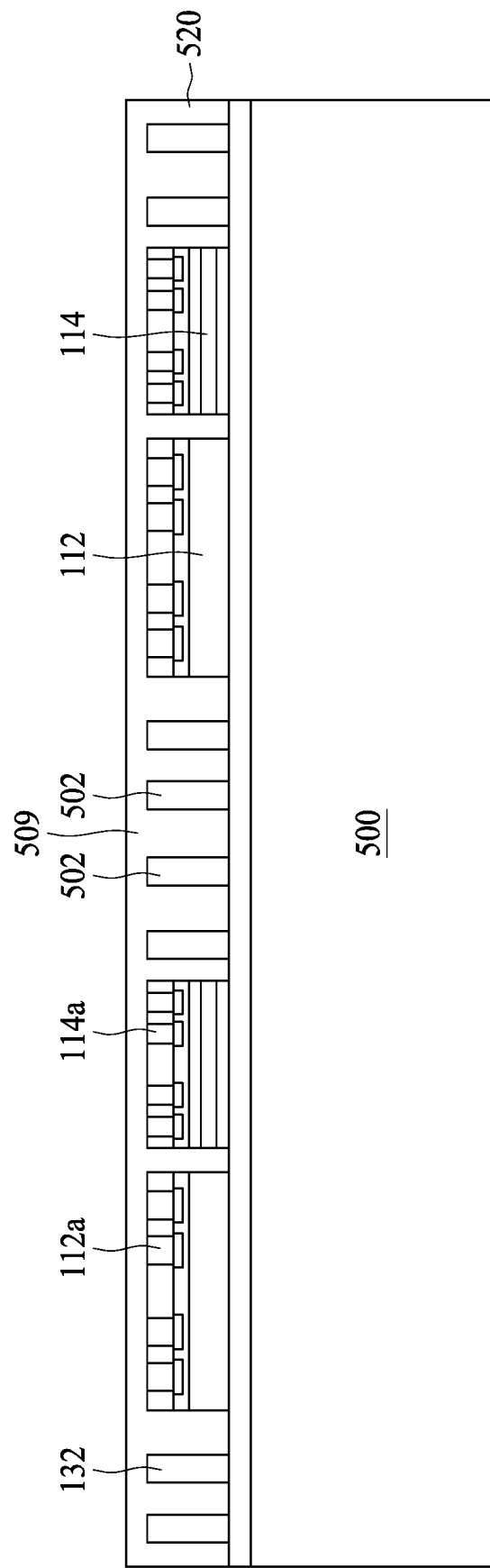

A molding is disposed over the top surface 501 and fills the empty space between the components and conductive feature and post. As in FIG. 8C, molding 521 is filled in the gap between the semiconductor dies 112 and 114, and gap (the scribe line region 509) between dummy conductive patterns 502. The molding may overfill to cover the top surfaces of conductive post 132, the dummy conductive pattern 502, and semiconductor dies 112 and 114. In some embodiments, the molding 521 is corresponding to the insulative material 104 in FIG. 1A. As used herein, "molding" refers to a compound formed with composite materials. Non-limiting examples of the molding materials includes epoxy resins, phenolic hardeners, silicas, catalysts, pigments, mold release agents, or the like. Material for forming a molding compound has a high thermal conductivity, a low moisture absorption rate, a high flexural strength at board-mounting temperatures, or a combination thereof.

Figure 8D:
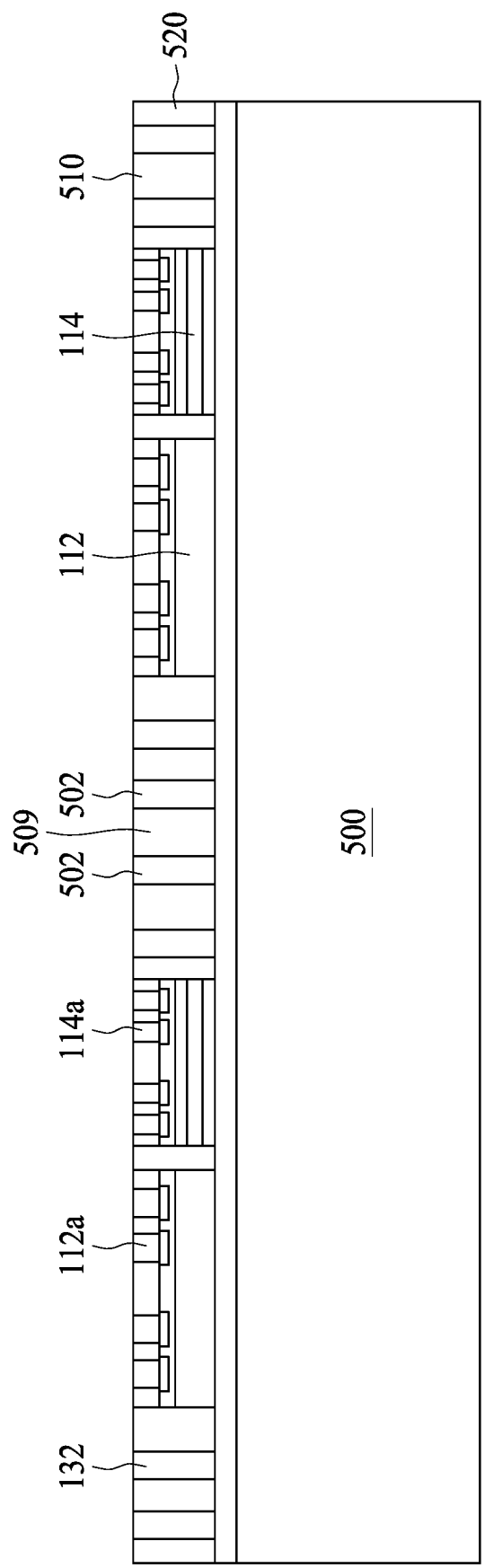
Figure 9:
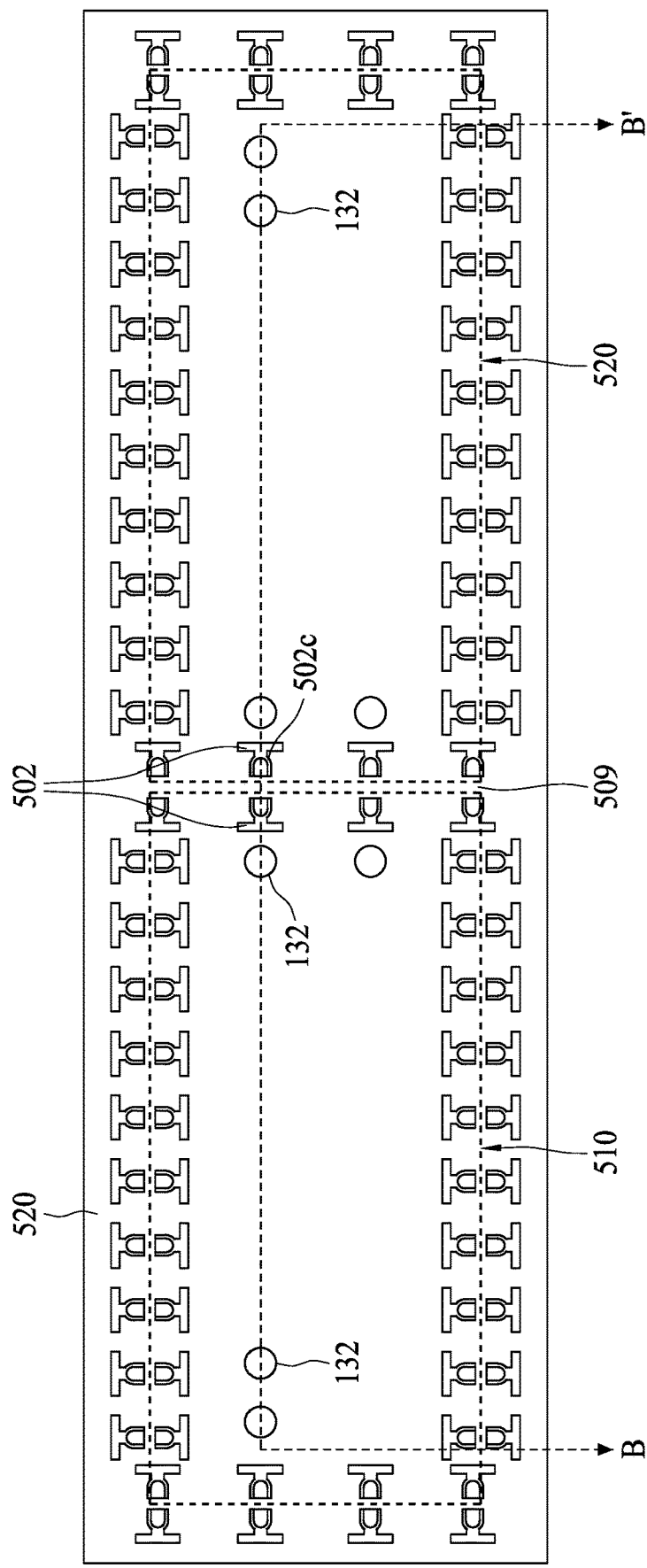
FIG. 9 is a top view of a portion of an anti-EMI semiconductor device in accordance with some embodiments.

A grinding or etch back operation is introduced to remove excessive molding in order to expose top surfaces of the conductive post 132 and dummy conductive pattern 502. As shown in FIG. 8D, a planar surface 510 is formed and the contact points of conductive post 132 are exposed in order to receive other conductive structures disposed later on. FIG. 9 is a top view of FIG. 8D and since the molding may be an opaque film, semiconductor dies 112 and 114 are not shown in FIG. 9. The layout in FIG. 9 is similar to the layout in FIG. 7C, one of the differences is the patterned layer 505 in FIG. 7C is replaced by the molding 521.

During a later-performed singulation operation, two cells 510 and 520 will be separated from the scribe line region 509. The molding in the scribe line region 509 is removed accompanied with a portion of the dummy conductive pattern 502. Portion 502c of each dummy conductive pattern 502 is most adjacent to the scribe line region 509 and designed to be removed partially so as to expose a conductive surface at the lateral direction, which is toward the scribe line region 509. The exposed conductive surfaces of portion 502c form the surfaces 102a and 102b in FIG. 3E. The dummy conductive pattern 502 can be used as the conductive feature 102 in FIG. 3E so as to contact with the EMI shield 105. The design of the recessed dummy conductive pattern 502 saves the usage of conductive material in the scribe line region 509. Most of the material removed during the later-performed singulation operation is the molding material.

The dummy conductive pattern 502 is formed concurrently with the conductive post 132 by sharing a same patterned layer, a same conductive filling operation, a same molding operation, and a grinding operation. It should be appreciated that an EMI grounding path is formed at the edge of the semiconductor package without introducing an extra mask or patterning operation.

Figure 10A:
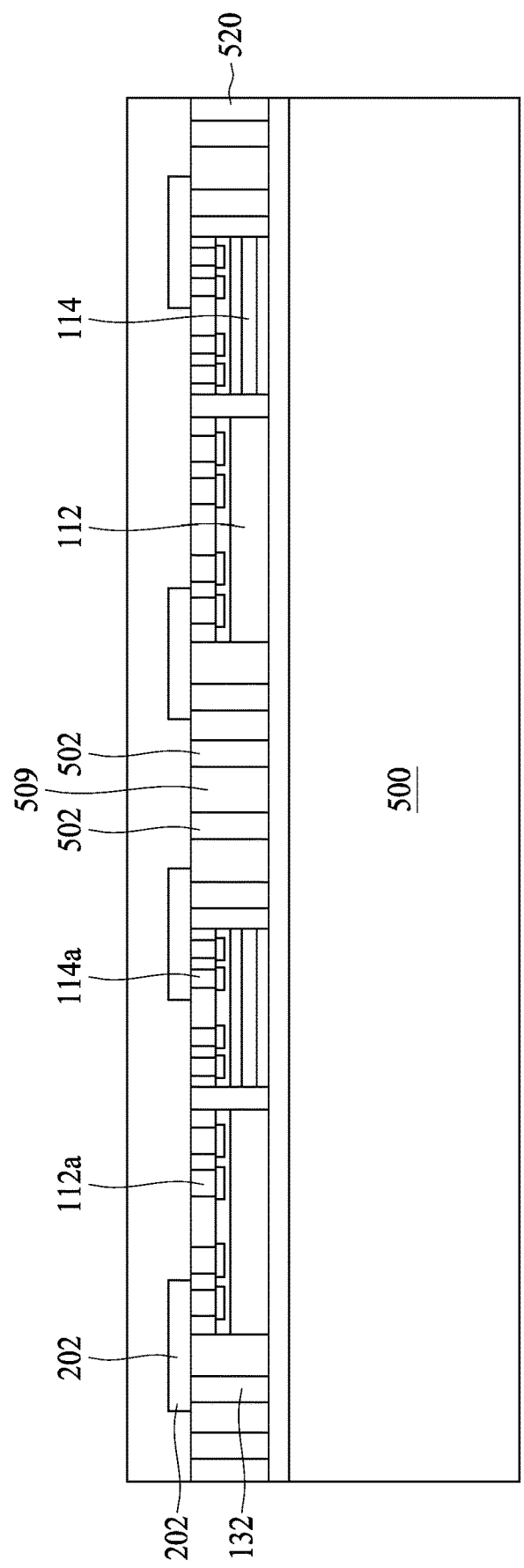
FIG. 10A to FIG. 10C are operations of a method of manufacturing an anti-EMI semiconductor device in accordance with some embodiments.

After the molding and grinding operations, RDL 202 is disposed over the molding 521 and conductive post 132 as shown in FIG. 10A. Active portion of the RDL 202 is also connected with the conductive post 132 and conductive pillars 112a and 114a of the semiconductor dies 112 and 114. Some portions of the RDL 202 are dummy and connected to the dummy conductive pattern 502.

Figure 10B:
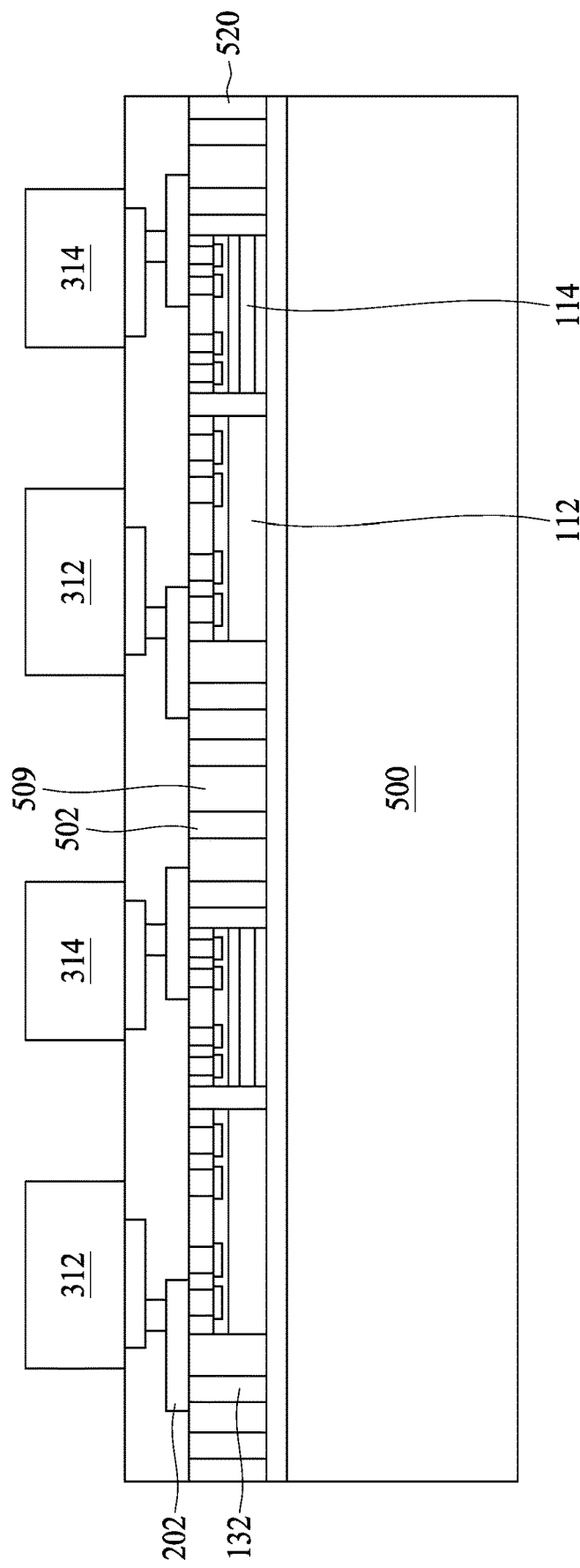

In FIG. 10B, electronic device 312 and semiconductor die 314 are mounted over the semiconductor dies 112 and 114 in each cell. The electronic components are electrically connected with the semiconductor dies 112 and 114 through an active RDL 202.

For some embodiments, a dielectric material different from molding is adopted to cover and surround the RDL 202. The dielectric material can be formed by vapor deposition. As used herein, "vapor deposition" refers to process of depositing materials on a substrate though the vapor phase. Vapor deposition processes include any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), PECVD, HDPCVD, LPCVD or the like.

Figure 10C:
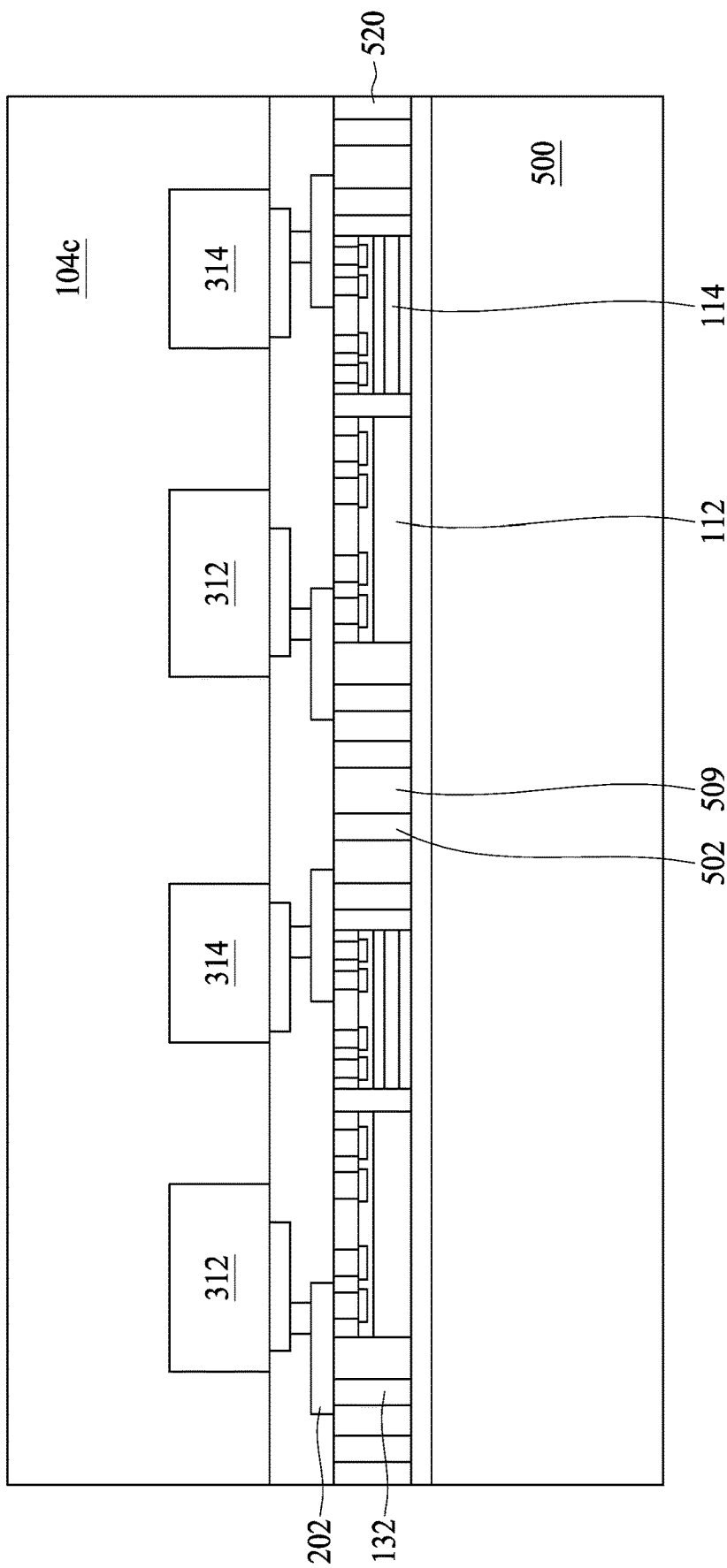

A molding corresponding to the insulative layer 104c in FIG. 1A can be further filled to surround the electronic components. As in FIG. 10C, electronic device 312 and semiconductor die 314 are covered by the insulative layer 104c. A preliminary wafer level fan-in or fan-out package is formed.

A singulation operation is performed to cut the wafer level package into several individual molded 3D semiconductor structures. In the present disclosure, there are various singulation operations such as saw blade cleaving or laser cutting are provided. The singulation is through the scribe line region 509 in FIG. 10C so as to separate adjacent cells. A portion of the dummy conductive pattern 502 in each cell is also removed to expose a conductive surface. The molded structure 110 in FIG. 1A is an exemplary 3D integrated semiconductor molded structure after the singulation operation. In some embodiments, the substrate 500 can be removed either before or after the singulation operation.

For each singulated 3D integrated semiconductor molded structure, a conductive film can be further disposed on. The conductive film can be formed through deposition such as vapor deposition processes including any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD) PECVD, HDPCVD, LPCVD or the like. The conductive film contacts the exposed conductive surface of the dummy conductive pattern 502 and further electrically connected to ground through the dummy conductive pattern 502.

Figure 11A:
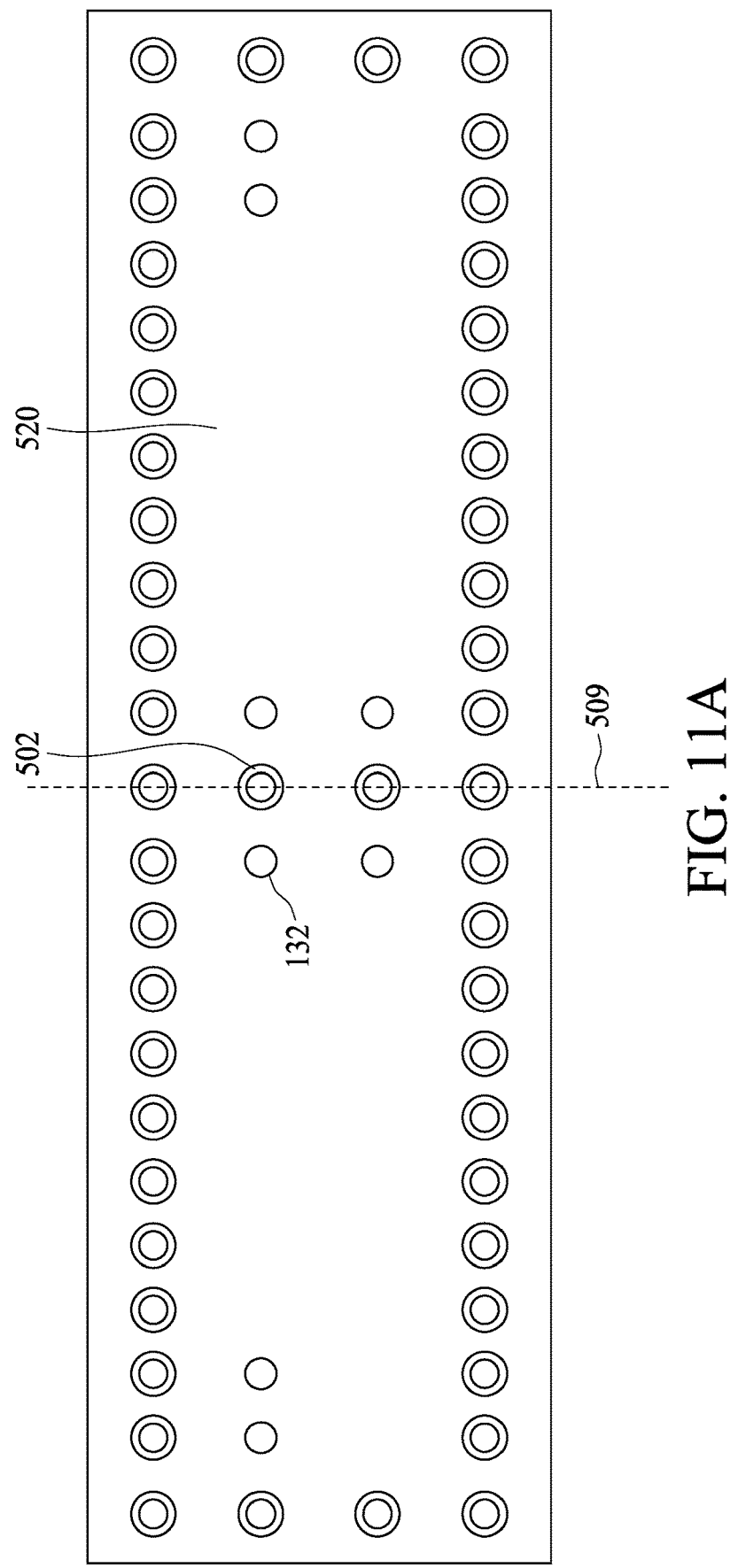
FIG. 11A to FIG. 11D are top views of a portion of an anti-EMI semiconductor device in accordance with some embodiments.

The dummy conductive pattern 502 can have various arrangements. In FIG. 11A is a top view of a dummy conductive pattern 502 in molding 521 according to an embodiment. The dummy conductive pattern 502 has a hollow hole inside. The hollow hole is not filled by molding 521. During singulation, the cut is through the hollow region of the dummy conductive pattern 502. Each dummy conductive pattern 502 is separated into two portions and each portion has a surface recessed toward the inner portion of each cell. In some embodiments, the center of the dummy conductive pattern 502 is not hollow but filled with an insulative material.

Figure 11B:
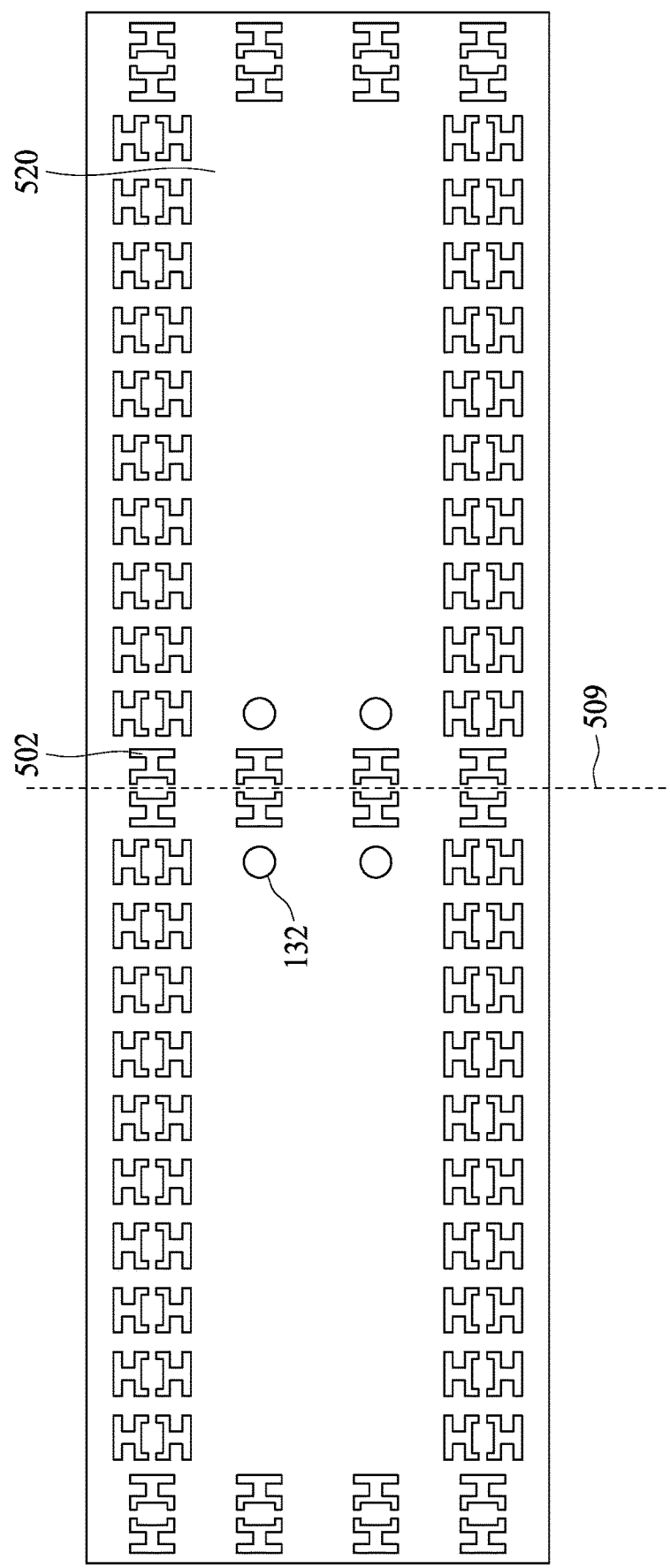
Figure 11C:
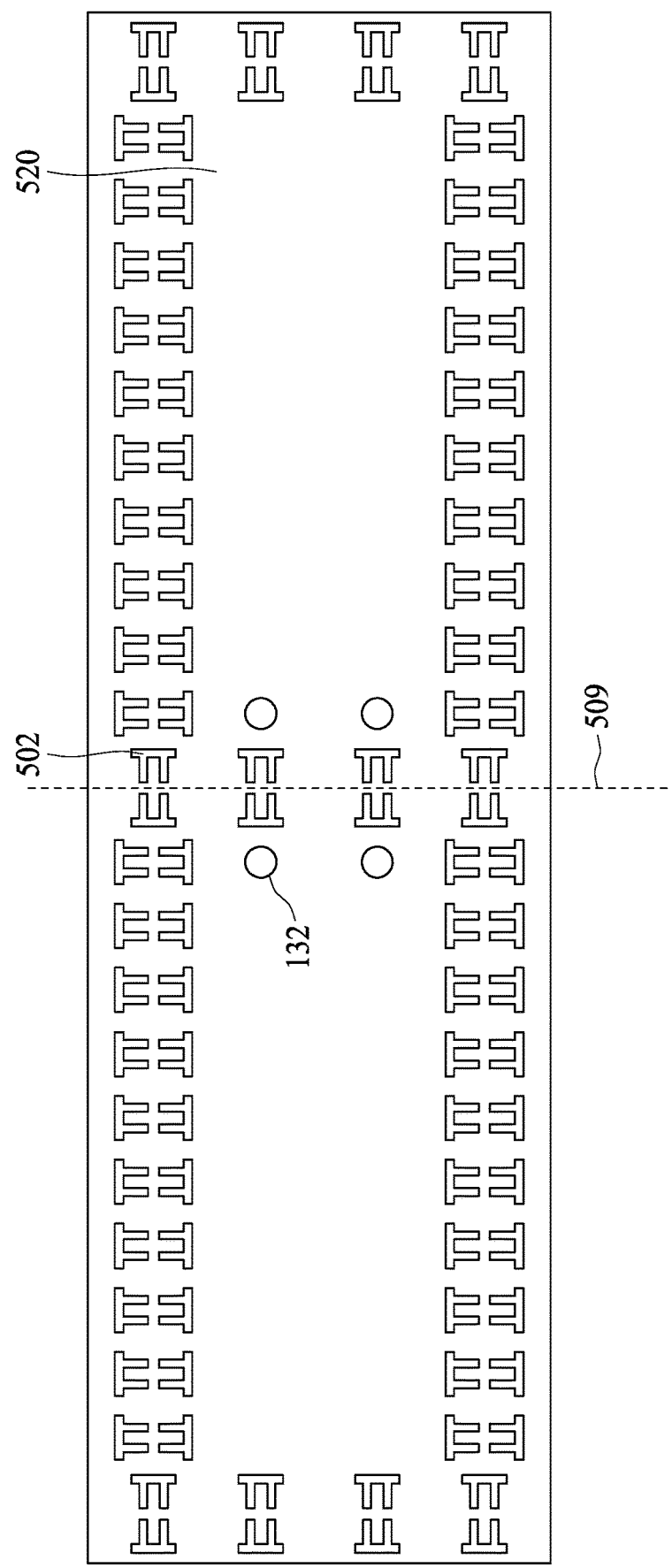
Figure 11D:
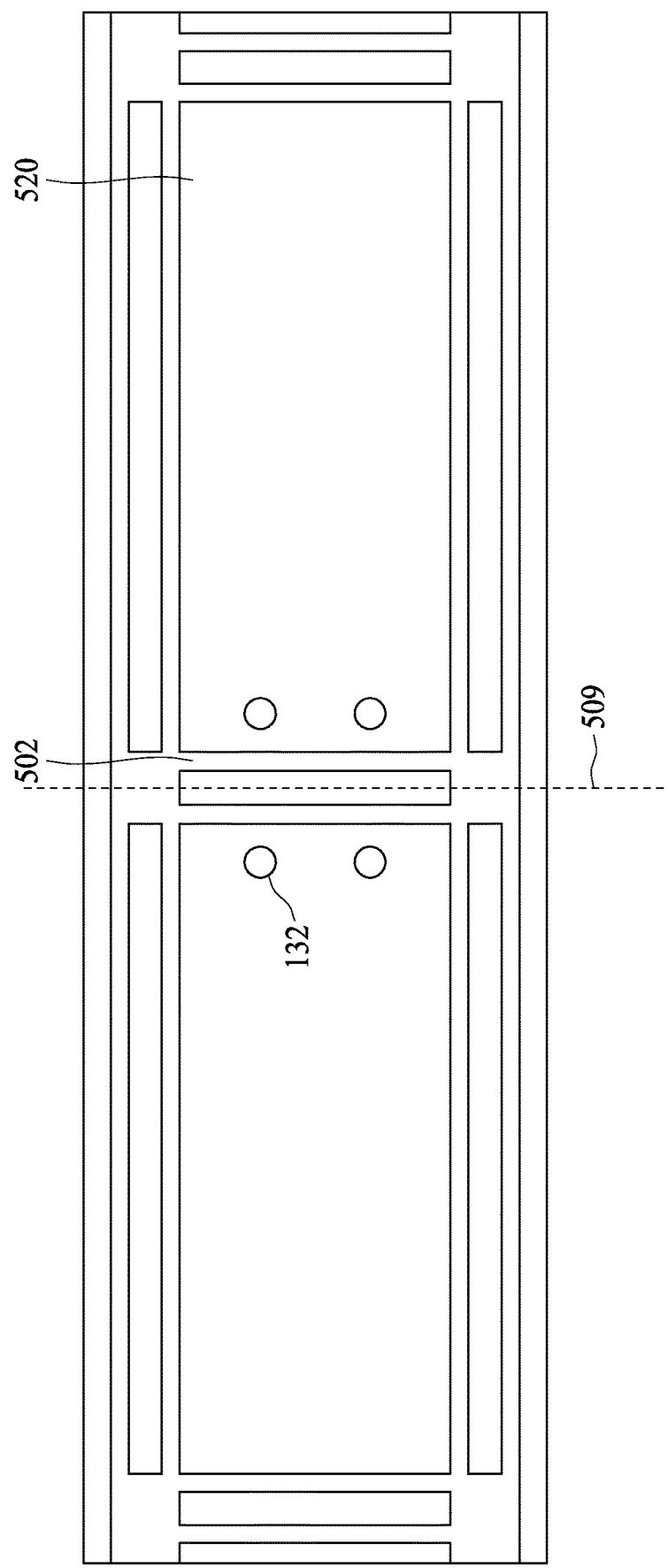

Examples in FIG. 11B and FIG. 11C are similar to the embodiment in FIG. 9, however, the dummy conductive pattern 502 has a different shape and design from the dummy unit in FIG. 9. In FIG. 11D, the dummy conductive pattern 502 is formed by several continuous conductive traces. The conductive traces may form a space between adjacent cells and the space is a portion of the scribe line region 509. The space may be hollow or filled with an insulative material. The singulated cell is corresponding to the embodiment in FIG. 6.

Figure 12:
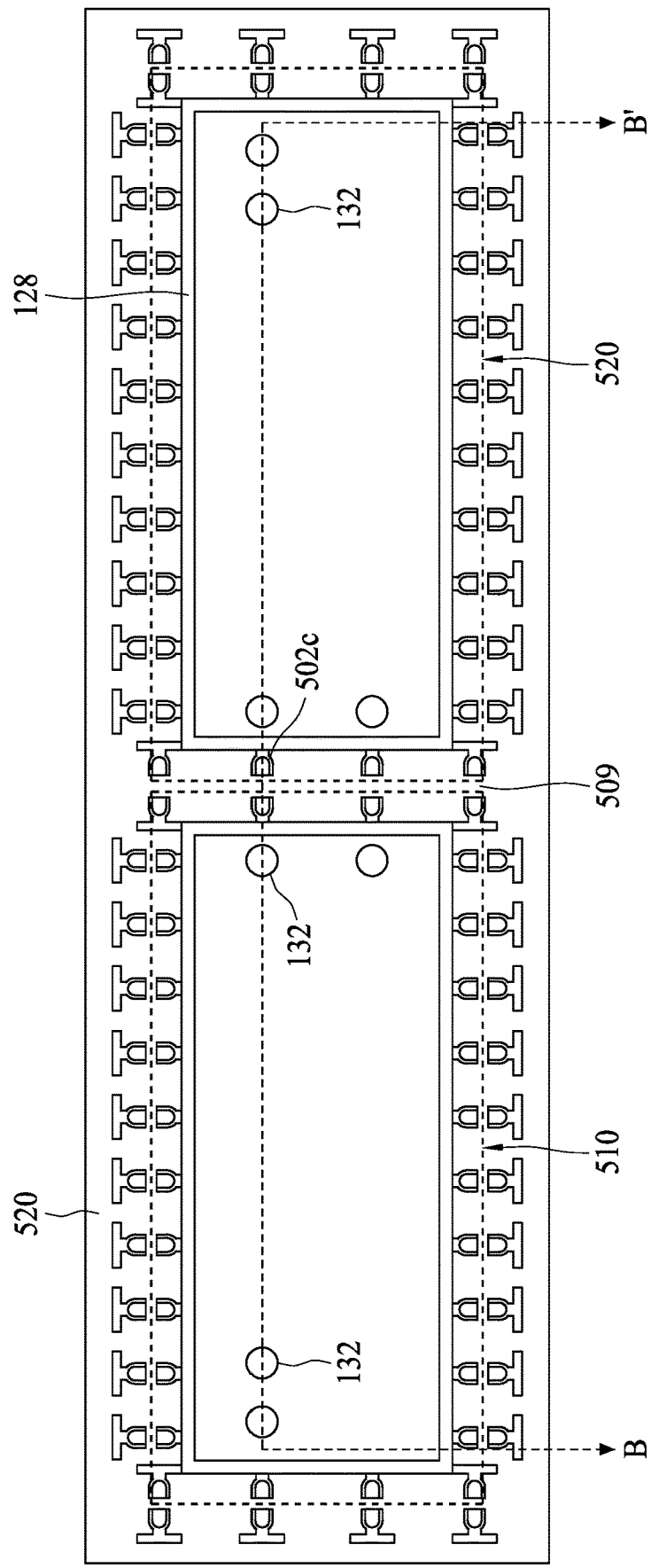
FIG. 12 is a top view of a portion of an anti-EMI semiconductor device in accordance with some embodiments.

In some embodiments, a seal ring is disposed over the dummy conductive pattern 502. As in FIG. 12, seal ring 128 is disposed over the dummy conductive pattern 502 and may be connected with the dummy conductive pattern 502 directly or through a dummy RDL. In some embodiment, the seal ring 128 is also a portion of the dummy RDL and formed concurrently with active RDL. The superimposed seal ring 128 concept can be applied to other dummy conductive pattern as mentioned in the present disclosure.

A semiconductor device is provided. The semiconductor device includes a semiconductor die having an insulative layer and a conductive feature in the insulative layer, and a shield in contact with a lateral surface of the conductive feature. In some embodiments, the lateral surface of the conductive feature is aligned with an edge of the insulating material.

In some embodiments, a semiconductor device is provided. The semiconductor device includes a semiconductor die, a first insulative layer surrounding the semiconductor die, and a conductive feature extended through the first insulative layer. In some embodiments, the conductive feature includes a top surface, a bottom surface and a lateral surface substantially perpendicular to the top surface and the bottom surface. In some embodiments, the lateral surface of the conductive feature is aligned with an edge of the first insulative layer, and the conductive feature is electrically connected to a shield through the lateral surface of the conductive feature.

In some embodiments, a semiconductor device is provided. The semiconductor device includes a semiconductor die, an insulative layer surrounding the semiconductor die. In some embodiments, the insulative layer includes an edge. The semiconductor device includes a conductive feature proximal to the edge of the insulative layer. In some embodiments, the conductive feature includes two lateral surfaces aligned with the edge of the insulative layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor die, wherein the semiconductor die has an insulative layer and a conductive feature in the insulative layer; and
    a shield in contact with a lateral surface of the conductive feature,
    wherein the lateral surface of the conductive feature is aligned with an edge of the insulative layer.

2. The semiconductor device of claim 1, wherein the insulative layer surrounds the semiconductor die.

3. The semiconductor device of claim 1, wherein a height of the conductive feature is substantially equal to a thickness of the insulative layer.

4. The semiconductor device of claim 1, further comprising an insulative material isolated from the insulative layer by the conductive feature, and the insulative material includes a lateral surface aligned with the lateral surface of the conductive feature and the edge of the insulative layer.

5. The semiconductor device of claim 4, wherein the conductive feature has a substantially semi-circular cross-sectional shape or a substantially U cross-sectional shape.

6. The semiconductor device of claim 1, wherein the conductive feature further includes one or more extension portions extended toward a direction opposite to the edge of the insulative layer.

7. The semiconductor device of claim 1, further comprising a ground terminal over a bottom surface of the insulative layer, wherein the shield is electrically connected to the ground terminal through the conductive feature.

8. The semiconductor device of claim 1, further comprising an active redistribution layer (RDL) over the insulative layer and electrically connected to the semiconductor die.

9. The semiconductor device of claim 8, wherein the conductive feature is electrically disconnected from the active RDL.

10. A semiconductor device, comprising:
    a semiconductor die;
    a first insulative layer surrounding the semiconductor die; and
    a conductive feature extended through the first insulative layer, wherein the conductive feature includes a top surface, a bottom surface and a lateral surface substantially perpendicular to the top surface and the bottom surface,
    wherein the lateral surface of the conductive feature is aligned with an edge of the first insulative layer, and the conductive feature is electrically connected to a shield through the lateral surface of the conductive feature.

11. The semiconductor device of claim 10, wherein a height of the conductive feature is substantially equal to a thickness of the first insulative layer.

12. The semiconductor device of claim 10, further comprising:
    a second insulative layer disposed over the semiconductor die, the conductive feature and the first insulative layer;
    an active redistribution layer (RDL) disposed in the second insulative layer and electrically connected to the semiconductor die; and
    a dummy RDL disposed in the second insulative layer and electrically connected to the shield and the top surface of the conductive feature, wherein the dummy RDL is disconnected from the semiconductor die;
    a terminal electrically connected to the bottom surface of the conductive feature.

13. The semiconductor device of claim 12, wherein a lateral surface of the dummy RDL is aligned with an edge of the second insulative layer and the lateral surface of the conductive feature, and the lateral surface of the dummy RDL is in contact with the shield.

14. The semiconductor device of claim 12, wherein the semiconductor die comprises a conductive pillar electrically connecting the semiconductor die and the active RDL.

15. The semiconductor device of claim 12, further comprising a conductive post in the first insulative layer and electrically connected to the active RDL.

16. A semiconductor device, comprising:
    a semiconductor die;
    an insulative layer surrounding the semiconductor die, wherein the insulative layer includes an edge; and
    a conductive feature proximal to the edge of the insulative layer, wherein the conductive feature includes two lateral surfaces aligned with the edge of the insulative layer.

17. The semiconductor device of claim 16, further comprising an insulative material isolated from the insulative layer by the conductive feature, wherein the insulative material includes a lateral surface aligned with the lateral surfaces of the conductive feature and the edge of the insulative layer.

18. The semiconductor device of claim 17, wherein the conductive feature has a substantially semi-circular cross-sectional shape or a substantially U cross-sectional shape.

19. The semiconductor device of claim 17, further comprising a shield in contact with both of the two lateral surfaces of the conductive feature.

20. The semiconductor device of claim 16, further comprising:
 a conductive structure disposed on a first end of the conductive feature; and
 a terminal disposed over a second end of the conductive feature,
wherein the conductive structure comprises a lateral surface aligned with at least one of the two lateral surfaces of the of conductive feature.

* * * * *